United States Patent [19]

Okumura et al.

[11] Patent Number: 5,717,256
[45] Date of Patent: Feb. 10, 1998

[54] POWER SUPPLY APPARATUS AND ELECTRONIC APPLIANCE EQUIPPED WITH THE POWER SUPPLY APPARATUS

[75] Inventors: Masafumi Okumura, Kawasaki; Mituo Saeki, Kawasaki; Hidetoshi Yano, Kawasaki; Hidekiyo Ozawa, Kawasaki, all of Japan

[73] Assignee: Fujitsu Limited, Kanagawa, Japan

[21] Appl. No.: 463,702

[22] Filed: Jun. 5, 1995

[30] Foreign Application Priority Data

Jun. 8, 1994 [JP] Japan ................ 6-125998
Oct. 20, 1994 [JP] Japan ................ 6-254943

[51] Int. Cl.⁶ ............................................ H02J 7/04
[52] U.S. Cl. ............................ 307/66; 307/43; 307/64; 320/2; 320/13; 320/48; 324/426; 324/427; 324/433; 324/435
[58] Field of Search .......................... 307/66, 64, 43; 320/2, 13, 48, 43; 324/426, 433, 435, 427; 340/635, 636

[56] References Cited

U.S. PATENT DOCUMENTS

| | | | |
|---|---|---|---|
| 3,784,892 | 1/1974 | Zelina | 320/39 |
| 4,558,281 | 12/1985 | Codd et al. | 324/433 |
| 4,961,043 | 10/1990 | Koenck | 320/21 |
| 5,119,011 | 6/1992 | Lambert | 320/43 |
| 5,148,053 | 9/1992 | Hirata et la. | 307/66 |
| 5,177,371 | 1/1993 | Faulk | 307/66 |
| 5,311,441 | 5/1994 | Tayama et al. | 364/483 |
| 5,321,627 | 6/1994 | Reher | 364/483 |
| 5,455,499 | 10/1995 | Uskali et al. | 320/43 |
| 5,477,129 | 12/1995 | Myslinski | 320/48 |

FOREIGN PATENT DOCUMENTS

| | | |
|---|---|---|
| 52-31642 | 3/1977 | Japan. |
| 57-188215 | 11/1982 | Japan. |
| 1-143986 | 6/1989 | Japan. |
| 4-326077 | 11/1992 | Japan. |
| 4-357480 | 12/1992 | Japan. |

Primary Examiner—William M. Shoop, Jr.
Assistant Examiner—Albert W. Paladini
Attorney, Agent, or Firm—Nikaido Marmelstein Murray & Oram LLP

[57] ABSTRACT

A power supply apparatus includes a battery, a voltage converter for converting the output of the battery to a different D.C. voltage by ON/OFF action of a main voltage converter control switch circuit, and a device for estimating a remaining capacity of the battery. The remaining battery capacity estimation device detects a non-load voltage of the battery when the main voltage converter control switch circuit is OFF, and estimates the remaining capacity of the battery.

62 Claims, 13 Drawing Sheets

|     | MARKS | REMAINING CAPACITY |
|-----|-------|--------------------|
| (1) |       | 0                  |
| (2) | ◨     | ~ 10%              |
| (3) | ■     | 10 ~ 25%           |
| (4) | ■ ■   | 25 ~ 50%           |
| (5) | ■ ■ ■ | 50 ~ 75%           |
| (6) | ■ ■ ■ ■ | 75% ~            |

POWER SUPPLY APPARATUS AND ELECTRONIC APPLIANCE EQUIPPED WITH THE POWER SUPPLY APPARATUS

BACKGROUND OF THE INVENTION

1. Field of the Invention

This invention relates to a power supply apparatus including a battery and capability of correctly estimating the remaining battery capacity, and an electronic appliance using such a power supply apparatus.

2. Description of the Related Art

Portable electronic devices in general use a battery as an internal power supply. Electronic devices of this kind do not normally operate when the battery is depleted. In an information processing device such as a notebook type personal computer, in particular, data being processed might disappear if the battery dies. Accordingly, users of such electronic devices must constantly monitor the remaining battery capacity.

Conventionally, the following two methods are known as methods of estimating the remaining capacity of a battery.

(1) The voltage of batteries such as lithium batteries, dry cell batteries, etc., drops as the battery is discharged. In such batteries, therefore, the remaining battery capacity can be estimated by measuring the battery voltage and estimating the remaining quantity from the measured voltage.

(2) The voltage of a NiCd battery, NiMH battery (nickel metal hydride), etc., during discharge remains constant at 1.2 V/cell irrespective of the discharged quantity, and the voltage drastically drops to 1.0 V/cell when the battery is depleted. Therefore, the remaining battery capacity cannot be estimated from only the measured voltage. With these types of batteries, therefore, a discharge current of the battery is measured and its accumulated value or the discharged quantity of the battery, is calculated. The remaining battery capacity is estimated from the difference between the rated battery capacity and the discharged battery quantity.

The capacity of ordinary batteries gradually decreases with repetitive charge-discharge cycles. For this reason, sometimes the actual remaining capacity is less than the remaining capacity estimated from the accumulation of the discharge current. To cope with this problem, a method has been employed which estimates remaining battery capacity from the accumulation of the discharge currents and at the same time, measures the battery voltage and detects a drastic voltage drop at the time of completion of discharge so as to determine that the remaining battery capacity is small. When the voltage drop at the time of completion of discharge occurs earlier than expected as described above, the value of the battery capacity used for the calculation of the remaining capacity is corrected to the actual capacity because the actual capacity is smaller than the expected capacity.

As described above, in order to estimate the remaining battery capacity, the battery voltage must be measured during discharge of the battery. However, the voltage that can be measured during discharge of the battery is the difference obtained by subtracting the voltage drop due to the internal resistance of the battery from the actual battery voltage. Further, this voltage drop changes depending on a load current. Because the battery voltage cannot be measured accurately in this way, the remaining battery capacity cannot be estimated accurately, either. Accordingly, the voltage under the non-load state of the battery must be measured as the battery voltage, but measurement of the non-load voltage is not done in practice because such a measurement during discharge is very difficult.

SUMMARY OF THE INVENTION

It is an object of the present invention to provide a power supply apparatus capable of accurately estimating a remaining battery capacity.

It is another object of the present invention to provide an electronic appliance using a power supply apparatus capable of accurately estimating a remaining battery capacity.

To accomplish the objects described above, a power supply apparatus according to the present invention comprises a battery, a switch circuit and a remaining battery capacity estimation device. The switch circuit consists of a part of a voltage converter by turning ON and OFF a battery output or switches alternately outputs of plural batteries. The remaining battery capacity estimation device measures a battery voltage when the switch circuit is OFF. Since the battery is under the non-load state when the switch circuit is OFF, the remaining battery capacity estimation device measures the non-load voltage of the battery, and can estimate an accurate remaining battery capacity by using this non-load voltage.

As the remaining battery capacity estimation device, the present invention can employ such a remaining battery capacity estimation device which accumulates the discharge current of the battery to calculate the discharged quantity, and calculates the remaining battery capacity from the difference between the battery capacity and the discharged quantity. In this case, the remaining battery capacity estimation device measures the non-load voltage of the battery, and detects that the actual remaining battery capacity becomes small earlier than the estimated remaining battery capacity.

By using the power supply device described above for an electronic appliance, the present invention can reliably prevent troubles due to dead batteries.

BRIEF DESCRIPTION OF THE DRAWINGS

The above and other objects and features of the present invention will be more apparent from the following description of the preferred embodiment with reference to the accompanying drawings, wherein:

FIG. 5 is a diagram showing the relation between a discharged quantity and voltage of a battery such as a NiCd battery, a NiMH battery, or the like;

DESCRIPTION OF THE PREFERRED EMBODIMENTS

Figure 1:
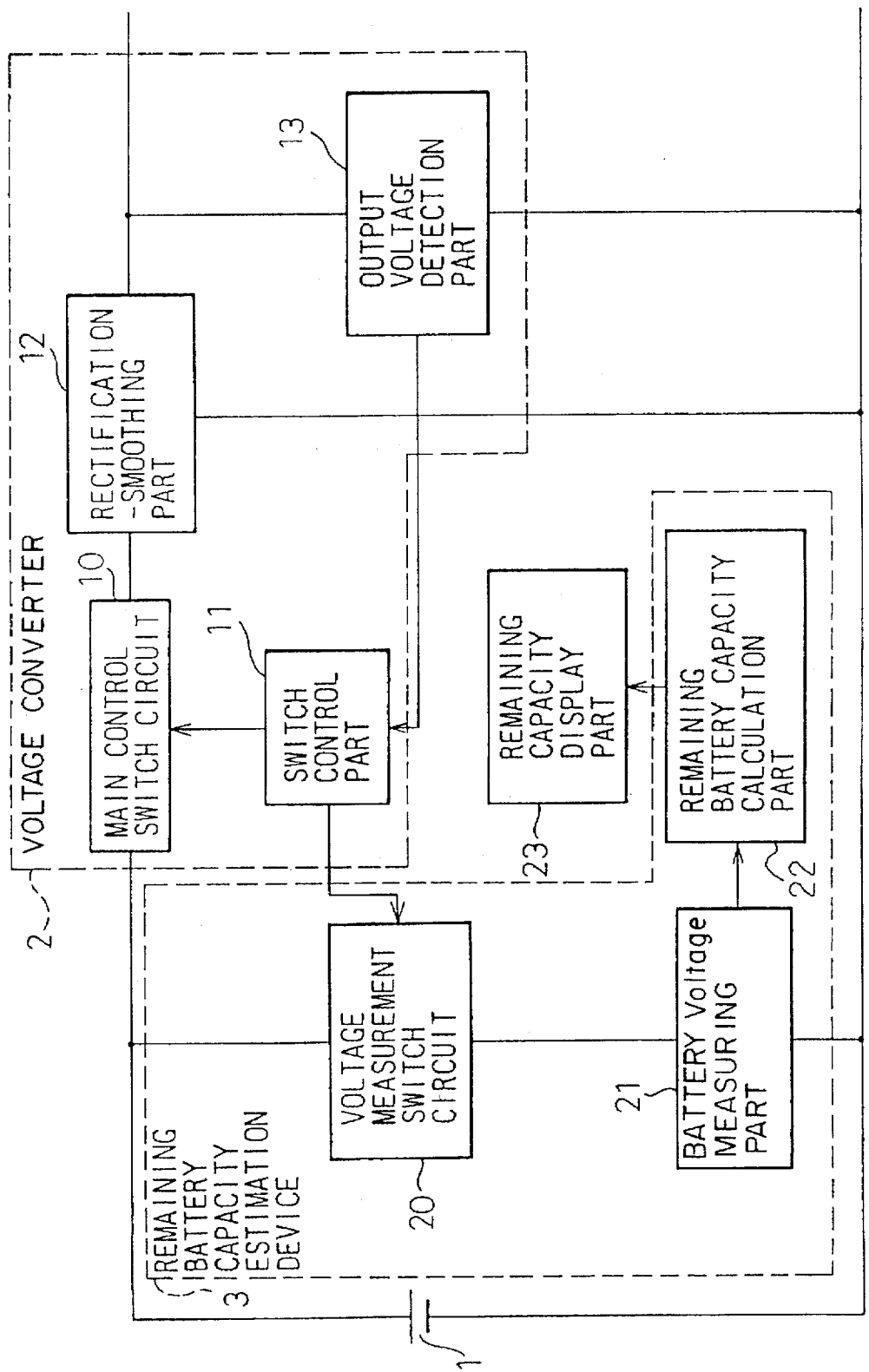
FIG. 1 is a circuit diagram of the first embodiment of the present invention.

FIG. 1 shows the first embodiment of the present invention. A power supply device shown in FIG. 1 can be suitably applied to a battery whose voltage gradually decreases with the progress of discharge, such as a lithium secondary battery or a dry cell battery.

Referring to FIG. 1, reference numeral 1 denotes a battery, 2 is a voltage converter and 3 is a remaining battery capacity estimation device.

In the voltage converter 2, reference numeral 10 denotes a main voltage converter control switch circuit, which continuously connects and cuts off the output of the battery 1.

Reference numeral 11 denotes a switch control part, which voltage converter controls ON/OFF of the main control switch circuit 10 and ON/OFF of a voltage measurement switch circuit 20 in accordance with a detected voltage of an output voltage detection part 13.

Reference numeral 12 denotes a rectification/smoothing part, which smoothes the intermittent current and voltage of the battery 1 generated by the ON/OFF action of the main voltage converter control switch circuit 10, and outputs a D.C. voltage.

Reference numeral 13 denotes an output voltage detection part, which detects the output voltage.

In the remaining battery capacity estimation device 3, reference numeral 20 denotes a voltage measurement switch circuit, which is turned ON while the main voltage converter control switch circuit 10 is OFF, and connects a battery voltage measuring part 21 and the battery 1.

Reference numeral 21 denotes the battery voltage measuring part, which measures the voltage of the battery 1 under a non-load state. Reference numeral 22 denotes a remaining battery capacity calculation part, which estimates the remaining capacity of the battery on the basis of the non-load voltage of the battery 1 which the battery voltage measuring part 21 measures.

The remaining battery capacity calculation part is constituted by a CPU.

Reference numeral 23 denotes a display part, which displays the remaining battery capacity.

The operation of the circuit shown in FIG. 1 will be explained next with reference to FIGS. 2 and 3.

Figure 2:
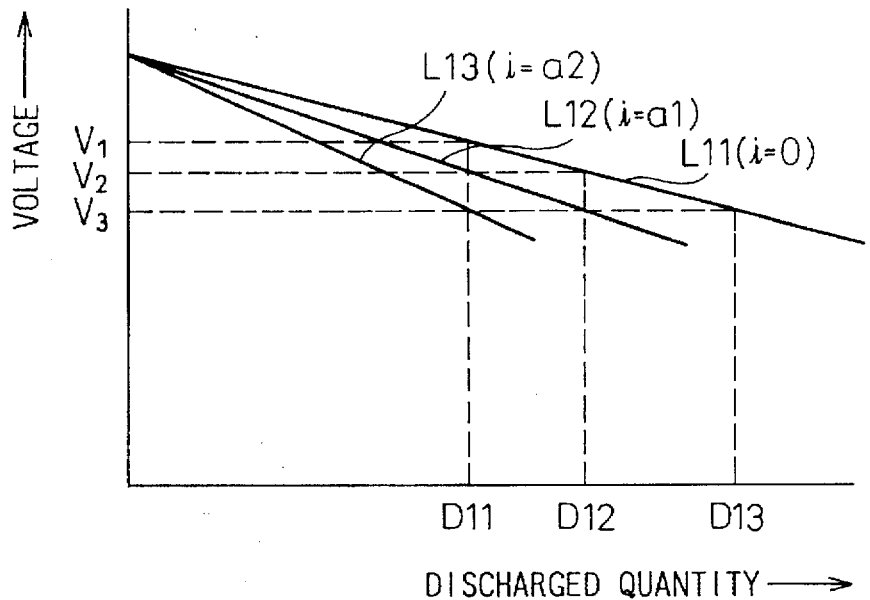
FIG. 2 is a diagram showing the relation between a discharged quantity and voltage of a battery such as a lithium secondary battery or a dry cell battery.

FIG. 2 shows the relation between a discharged quantity and a battery voltage of a lithium secondary battery, a dry cell battery, or the like. A straight line L11 in FIG. 2 represents the characteristics at the time of non-load of the battery (i=0). As the discharged quantity becomes large and the remaining battery capacity becomes small, the battery voltage decreases. A discharged quantity D11 is obtained from a measured voltage V1 by utilizing this relation, and the remaining battery capacity can be obtained by then calculating the difference between the battery rated capacity and the discharged quantity D11. Accordingly, the remaining battery capacity can be correctly estimated by measuring the non-load voltage of the battery.

In contrast, when a load is connected to the battery and the battery voltage is measured under the state where the load current flows (i=a1), the battery voltage shows a lower value V2 than the non-load voltage V1 due to the voltage drop. This state is represented by the straight line L12. When the battery voltage V2 is obtained in this manner under the state where the load current flows, the discharged quantity obtained from the battery voltage V2 becomes D12, though the actual discharged quantity of the battery is D11, so that the accurate discharged quantity cannot be detected. Further, the discharged quantity changes as represented by the straight line L13 in FIG. 2 in accordance with the change of the internal resistance for each battery or with the change of the load current depending on the load, and shows in some cases the discharge quantity D13. Accordingly, the remaining battery capacity cannot be correctly estimated under the state where the load current flows through the battery.

In contrast, in this embodiment, a power supply device detects the non-load voltage and calculates the correct remaining battery capacity in the following way.

Figure 3A:
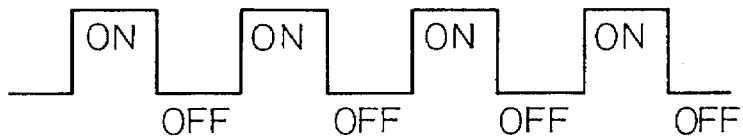
FIGS. 3A and 3B are diagrams showing the operation of the circuit shown in FIG. 1.
Figure 3B:
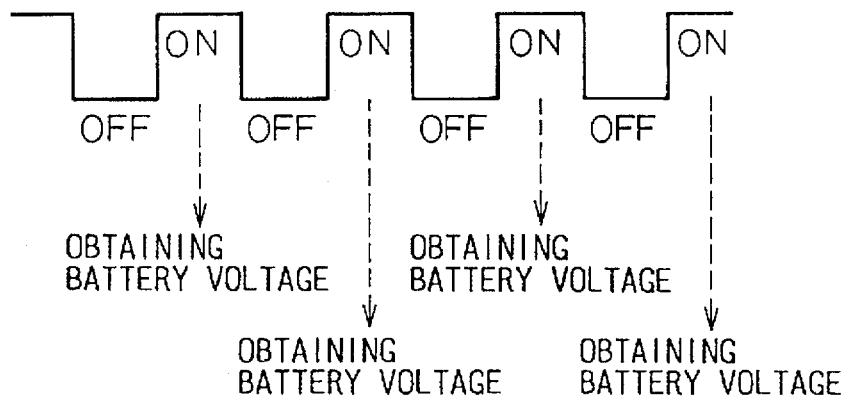

FIG. 3A shows the ON/OFF operation of the main voltage converter control switch circuit 10, and FIG. 3B shows the ON/OFF operation of the voltage measurement switch circuit 20.

As shown in FIGS. 3A and 3B, in the present invention, the phase of the ON/OFF operation of the main voltage converter control switch circuit 10 is shifted from that of the ON/OFF operation of the voltage measurement switch circuit 20, and the non-load voltage of the battery 1 is measured while the main voltage converter control switch circuit 10 is OFF and the voltage measurement switch circuit 20 is ON with the battery 1 being kept under the non-load state.

In the voltage converter 2, the switch control part 11 voltage converter controls the ON/OFF action of the main control switch circuit 10. The rectification-smoothing part 12 rectifies the current and the voltage intermitted by the main voltage converter control switch circuit 10 and outputs a D.C. voltage. The output voltage detection part 13 detects the output voltage and transmits this signal to the switch control part 11. The switch control part 11 reduces the ON period of the main voltage converter control switch circuit 10 when the output voltage changes to a higher side, and prolongs the ON period when the output voltage changes to a lower side (i.e. the switch part controls the conversion of the voltage output by the battery based on the voltage detected by the output voltage detector part so that a stabilized voltage is output).

On the other hand, the switch control part 11 turns ON the voltage measurement switch circuit 20 when the main voltage converter control switch circuit 10 is OFF, and turns it OFF when the main voltage converter control switch circuit 10 is ON.

In the remaining battery capacity estimation device 3, the battery 1 and the battery voltage obtaining part 21 are connected when the voltage measurement switch circuit 20 is ON, and the battery voltage measuring part 21 measures the non-load voltage of the battery 1.

The remaining battery capacity calculation part 22 calculates the discharged quantity of the battery from the voltage value measured by the battery voltage measuring part 21 in accordance with the graph shown in FIG. 2 or with a suitable calculation formula, and calculates the remaining battery capacity from the difference between the discharged quantity and the battery capacity. The value so obtained is displayed as the remaining battery capacity by a display part 23.

Figure 4:
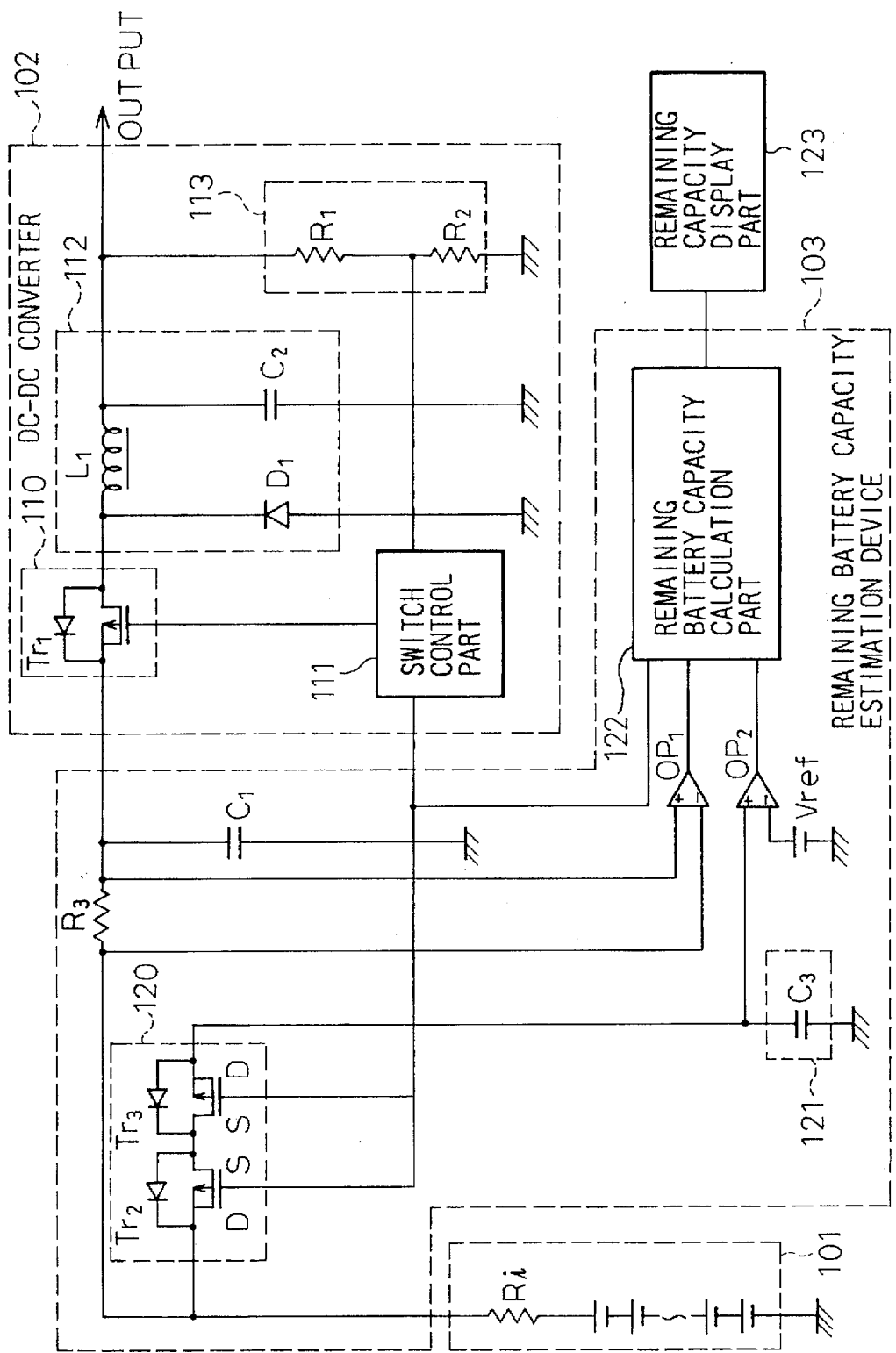
FIG. 4 is a circuit diagram of the second embodiment of the present invention.

FIG. 4 shows the second embodiment of the present invention. A power supply device shown in FIG. 4 can be suitably applied to a battery of the type in which the voltage remains constant during discharge irrespective of the discharged quantity but drops drastically at the finish of discharge, such as a NiCd battery or a NiMH battery.

In FIG. 4, reference numeral 101 denotes a battery, and Ri is an internal resistance. Reference numeral 102 denotes a DC-DC converter (which corresponds to the voltage converter 2 shown in FIG. 1), and reference numeral 103 denotes a battery remaining capacity estimation device.

In the DC-DC converter 102, reference numeral 110 denotes a switch circuit (which corresponds to the main voltage converter control switch circuit 10 in FIG. 1), and Tr1 is a transistor for switching, which is a p-channel MOS transistor.

Reference numerals 111 and 112 denote a switch control part and a rectification-smoothing part, respectively.

Symbol L1 denotes a choke coil, C2 is a smoothing capacitor and D1 is a diode. Reference numeral 113 denotes an output voltage detection part, and symbols R1 and R2 denote voltage division resistors, respectively.

In the remaining battery capacity estimation device 103, reference numeral 120 denotes a switch circuit (which corresponds to the voltage measurement switch circuit 20 in FIG. 1), and Tr2 and Tr3 are switching transistors, which are p-channel MOS transistors.

Reference numeral 121 denotes a battery voltage measuring part. Symbol C3 denotes a capacitor, which stores charge flowing from the battery 101, and has a small capacitance for generating a voltage equal to the non-load voltage of the battery 101. Reference numeral 122 denotes a remaining battery capacity calculation part, which calculates the remaining capacity of the battery 101 on the basis of the non-load voltage of the battery 101.

The remaining battery capacity calculation part is constituted by a CPU.

Symbol OP1 denotes a comparator, which compares the voltages at both ends of the resistor R3 and generates a voltage in accordance with the current flowing through the resistor R3.

Symbol OP2 denotes a comparator, which compares the voltage measured by the battery voltage measuring part 121 with the reference voltage Vref and generates a voltage in accordance with the measured voltage.

Symbol R3 denotes a resistor for measuring current and C1 denotes an input capacitor. Reference numeral 123 denotes a remaining capacity display part, which represents the remaining battery capacity.

In the DC-DC converter 102, the current flows through the choke coil L1 (hereinafter called "L1") while the transistor Tr1 (hereinafter called "Tr1") is ON, and energy is built up. While Tr1 is OFF, the current flows through the circuit of L1-capacitor C2-diode D1 due to energy built up in L1, and a boosted D.C. voltage is output. The output voltage detection part 113 divides the output voltage, detects its fluctuation and transmits its signal to the switch control part 111. (Hereinafter, the capacitor C2 and the diode D1 will be called "C2" and "D1", respectively.) The switch control part 111 prolongs the ON period of Tr1 to increase the energy supplied to L1 when the output voltage drops, and reduces the ON period of Tr1 to decrease the energy supplied to L1 when the output voltage becomes high. In this way, the DC-DC converter 102 stabilizes the output voltage.

Next, the operation of the circuit shown in FIG. 4 will be explained.

The switch control part 111 outputs an L signal to the gates of Tr2 and Tr3 while an H signal is output to the gate of Tr1 (at this time, Tr1 is OFF). Accordingly, while Tr1 is OFF, Tr2 and Tr3 are ON. At this time, no load is applied to the battery 101. Because Tr2 and Tr3 are ON, the current flows from the battery 101 to the capacitor C3 and is built up in the capacitor C3, and a non-load voltage of the battery 101 develops across both ends of the capacitor C3.

Next, the switch control part 111 outputs L to the gate of Tr1 and H to the gates of Tr2 and Tr3. Therefore, Tr1 is ON, and the current flows from the battery 101 to L1 and energy is built up in L1. Since Tr2 and Tr3 are OFF at this time, the voltage measured by the battery voltage measuring part 121 is held.

Next, the operation of the remaining battery capacity calculation part 122 will be explained.

Figure 5:
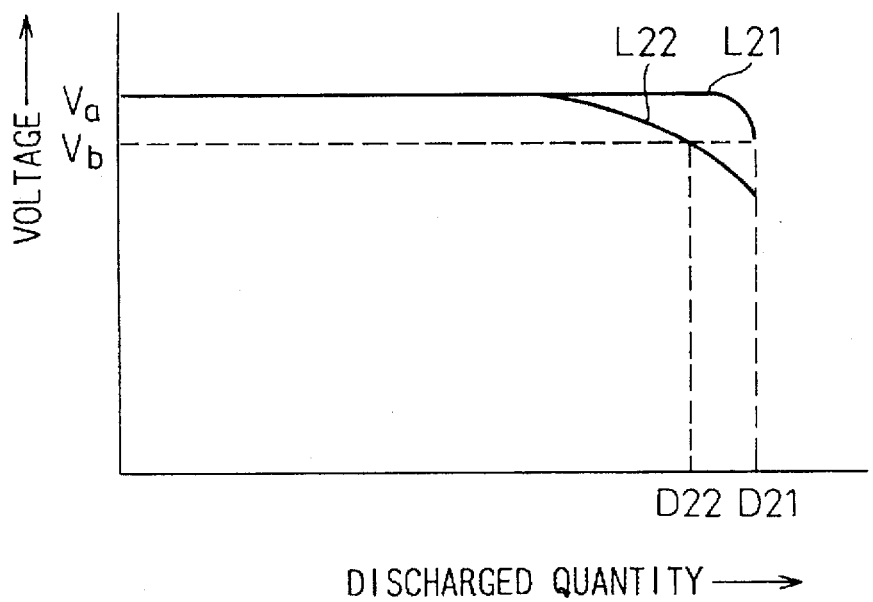

FIG. 5 shows the relation between the discharged quantity of the battery such as a NiCd battery or a NiMH battery and a battery voltage. A curve L21 in FIG. 5 represents the characteristics when no load exists or the load current is small, and the battery voltage during discharge remains a constant value Va irrespective of the discharged quantity. The voltage drastically drops when discharge is depleted. A curve L22 in FIG. 5 represents the characteristics when the load current is large. The curve indicates that when the discharged quantity becomes large, the battery voltage drops.

Figure 6:
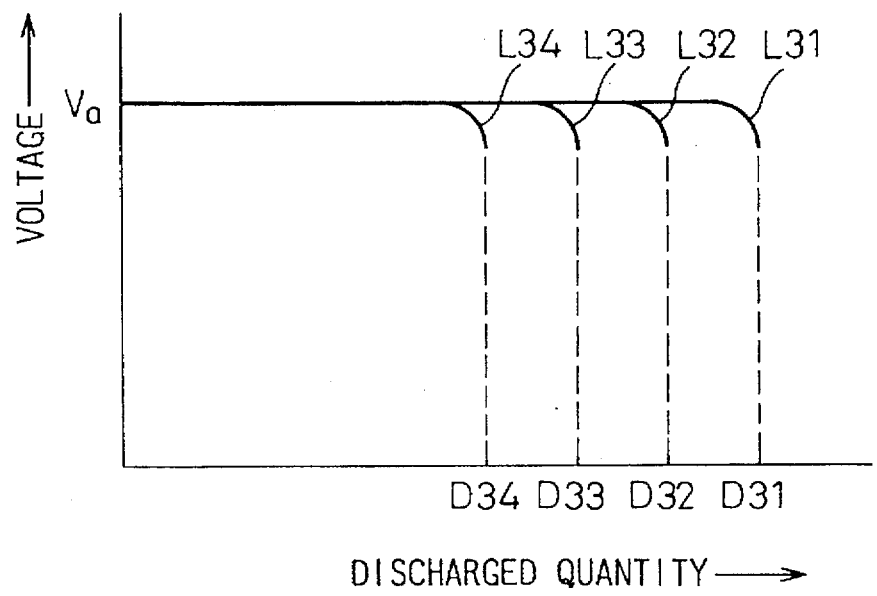
FIG. 6 is a diagram showing a decrease of battery capacity due to repetition of a charge-discharge cycle in the battery shown in FIG. 5.

FIG. 6 represents that the battery capacity decreases with a repetitive charge-discharge cycle. Assuming that discharge of a new battery finishes at a discharged quantity D31 as represented by a curve L31, the battery whose capacity decreases after the repetition of charge-discharge finishes its discharge at a smaller discharged quantity D32 as indicated by a curve L32. When charge-discharge is further repeated, the battery capacity gradually decreases as indicated by curves L33 and L34.

The remaining battery capacity calculation part 122 shown in FIG. 4 calculates the discharged quantity by accumulating the battery current or by accumulating discharged electric power (battery voltage×battery current), and calculates the remaining battery capacity from the difference between the battery rated capacity and the discharged quantity. The remaining battery capacity so calculated is displayed by the display part 123.

When the battery capacity decreases with repetitive charge-discharge cycles, the actual remaining battery capacity becomes zero (0) before the estimated remaining battery capacity reaches zero as shown in FIG. 6, and the battery voltage drops earlier. Accordingly, an alarm is raised when the battery voltage is lower than a predetermined value Vb (for example, 80% of the rated voltage Va).

When the battery voltage is measured while the load current flows through the battery as represented by the curve L22 shown in FIG. 5 when the drop of the remaining battery capacity is detected by the drop of the battery voltage, the remaining battery capacity is determined as being exhausted because the voltage drop is lower than the predetermined voltage Vb, although the battery can be used in practice up to the discharged quantity D21. In contrast, when the non-load voltage is measured, the decrease of the remaining battery capacity can be accurately detected in accordance with the characteristics indicated by the curve L21.

The operation of the remaining battery capacity calculation part 122 will be explained next with reference to the flowcharts of FIGS. 7, 8 and 9.

Figure 7:
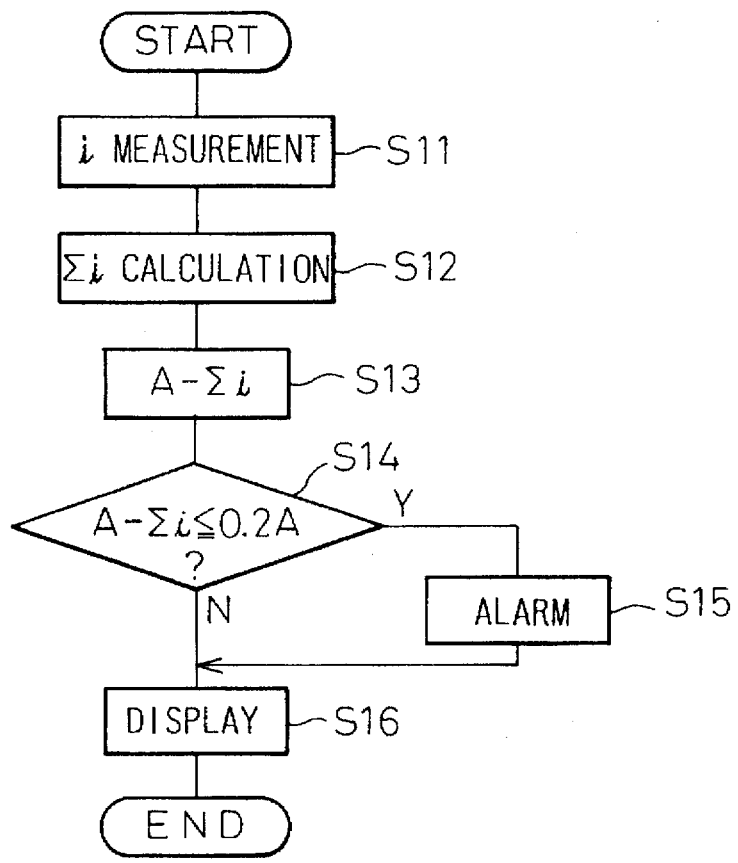
FIG. 7 is a first flowchart useful for explaining the operation of the circuit shown in FIG. 4.

FIG. 7 shows the operations of estimating the remaining battery capacity from the accumulated value of the discharge current of the battery and displaying the remaining battery capacity. The operation shown in FIG. 7 is carried out when the switch control part 111 turns ON the main voltage converter control switch circuit 110. First, the battery current i is measured at the step S11, and the accumulated value $\Sigma i$ of the current i is determined at the step S12. This $\Sigma i$ value is the discharged quantity of the battery 101. The difference of the battery capacity A from the discharged quantity $\Sigma i$ is calculated at the step S13, and this difference becomes the remaining battery capacity. Incidentally, when the battery is new, the battery capacity A is equal to the battery rated capacity. Whether or not the remaining battery capacity (A-$\Sigma i$) is below 20% of the battery capacity A is determined at the step S14. If it proves NO, the flow proceeds to the step S16 and if it proves YES, the flow proceeds to the step S15, where an alarm is raised to notify the user that the remaining battery capacity is small. This warning can be represented by sound or can be displayed by the remaining capacity display part 123. The remaining battery capacity (A-$\Sigma i$) is displayed on the display part 123 at the step S16.

Figure 8:
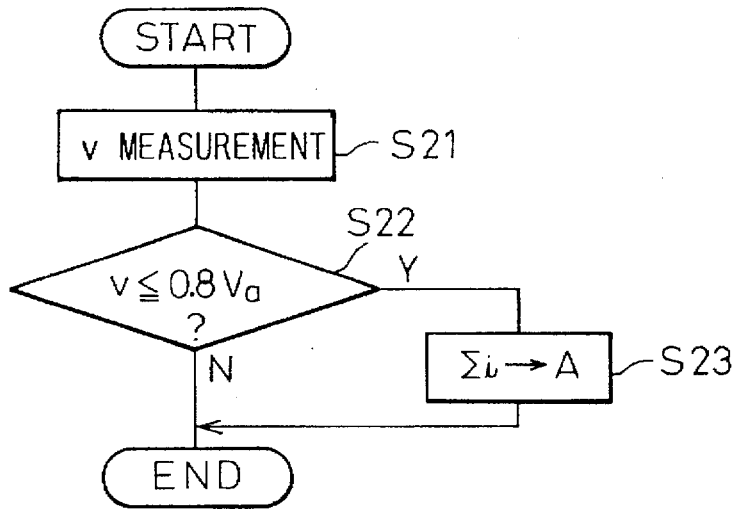
FIG. 8 is a second flowchart useful for explaining the operation of the circuit shown in FIG. 4.

FIG. 8 shows the procedures for detecting the state where the remaining battery capacity becomes small by measuring the battery voltage, and further correcting the battery capacity. The operation shown in FIG. 8 is effected when the switch control part 111 turns OFF the main voltage converter control switch circuit 110. The battery voltage v is measured at the step S21. Whether or not the battery voltage v drops below 80% of the rated voltage Va is determined at step S22. Here, if the battery voltage v is above at least 80%, the processing is completed. When it drops below 80%, the battery capacity A is rewritten to the current accumulated value $\Sigma i$ obtained at the step S12 in FIG. 7, at the step S23.

When the processing of the step S23 is executed in the processing shown in FIG. 8, A-$\Sigma i$ becomes zero (0) because $\Sigma i$ is set to the battery capacity A at the step S13 in FIG. 7 when the switch control part 111 thereafter turns ON the main voltage converter control switch circuit 110, and the flow proceeds from the step S14 to the step S15 to raise the alarm, and the step S16 represents that the remaining battery capacity becomes zero.

Thereafter, when the battery is charged and is again used, the accumulated current value $\Sigma i$ at completion of previous discharge, that is, the battery capacity at the time of the previous use, is set to the battery capacity A at that time. Accordingly, to calculate the remaining battery capacity at this time, the remaining battery capacity is correctly calculated based on the actual battery capacity which has decreased.

Figure 9:
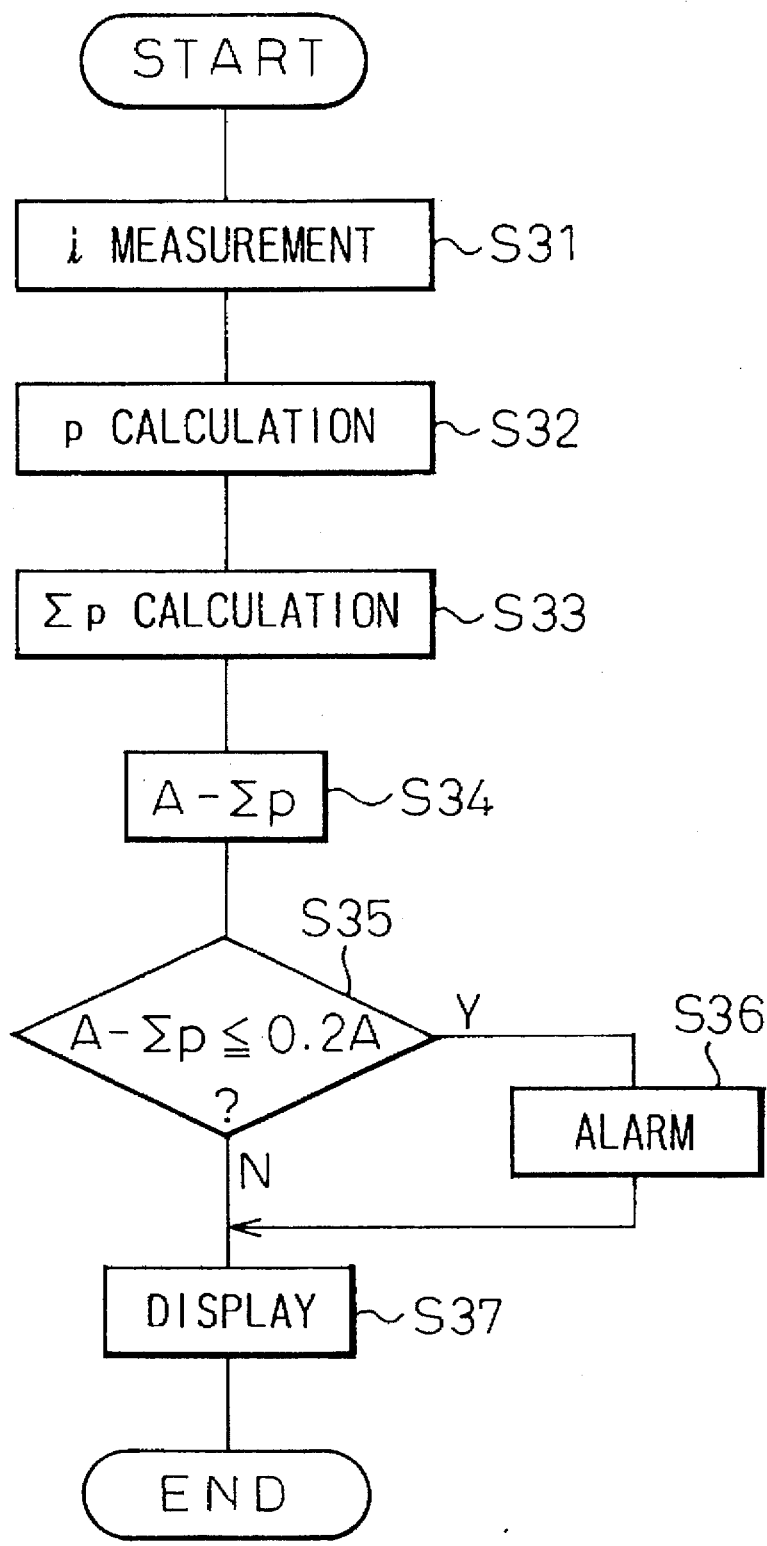
FIG. 9 is a flowchart showing a modified embodiment of the flowchart shown in FIG. 7.

FIG. 9 which is a modified example of the flowchart shown in FIG. 7 shows the operations of estimating the remaining battery capacity from the accumulated value of the discharge electric power and displaying the remaining battery capacity. The operation shown in FIG. 9 is carried out when the switch control part 111 turns ON the main voltage converter control switch circuit 110. First, the battery current i is measured at the step S31. The discharged electric power p is calculated from the current i and the non-load voltage obtained at the step S21 in FIG. 8 at the step S32, and the accumulated value $\Sigma p$ of the electric power is calculated at the step S33. This $\Sigma p$ value is the discharged quantity of the battery 101. The difference of the battery capacity A from the discharged quantity $\Sigma p$ is calculated at the step S34, and this difference becomes the remaining battery capacity. Whether or not the remaining battery capacity (A-$\Sigma p$) is below 20% of the battery capacity A is determined at the step S35. If it proves NO, the flow proceeds to the step S37 and if it proves YES, the flow proceeds to the step S36, where an alarm is raised to notify the user that the remaining battery capacity is small. This warning can be represented by sound or can be displayed by the remaining capacity display part 123. The remaining battery capacity (A-$\Sigma p$) is displayed on the display part at the step S37.

Figure 10:
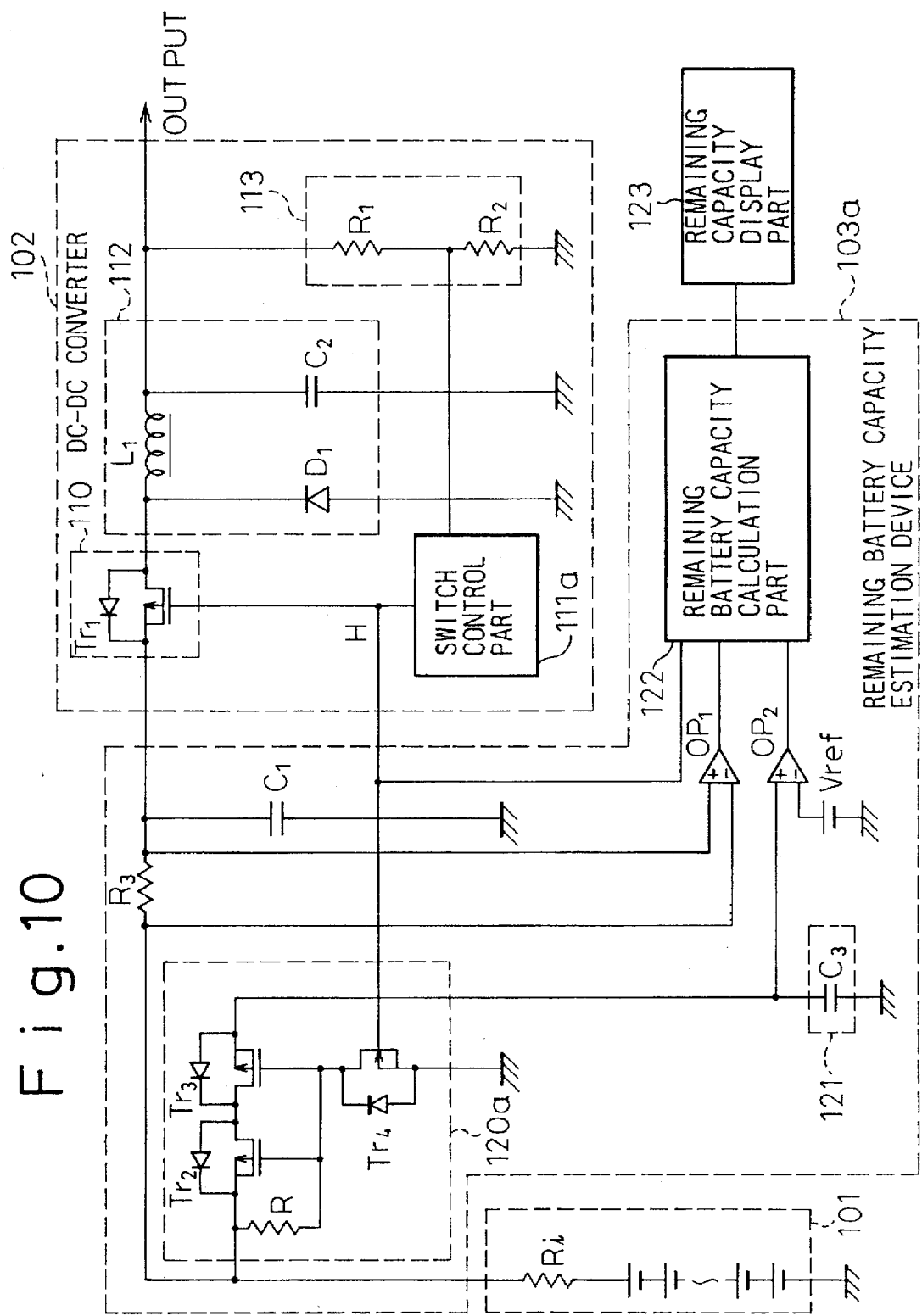
FIG. 10 is a circuit diagram showing a modified embodiment of the circuit shown in FIG. 4.

FIG. 10 shows a modified embodiment of the circuit shown in FIG. 4. The difference of FIG. 10 from FIG. 4 resides in the construction of the switching control part 111a and the voltage measurement switch circuit 120a, and the rest of the circuit is the same. Therefore, the overlapping explanation will be omitted. An n-channel MOS transistor Tr4 is interposed between the gates of the switching transistors Tr2 and Tr3 and ground, and the control signal of the switch control part 111a is applied to the gate of this Tr4.

In this circuit, the switch control part 111a outputs the same signal to Tr1 and Tr4. Assuming now that the L signal is output, Tr1 is turned ON and consequently, the main voltage converter control switch circuit 110 is turned ON. On the other hand, since Tr4 is ON and Tr2 and Tr3 are OFF, the voltage measurement switch circuit 120 is turned OFF. When the switch control part 111 outputs the H signal, the main voltage converter control switch circuit 110 is turned ON and the voltage measurement switch circuit 120 is turned OFF. According to the circuit shown in FIG. 10, the switch control part 111a outputs one kind of signal.

The second embodiment explained above and shown in FIGS. 4 and 10 applies to the case where the battery 101 is of the type whose voltage remains constant during discharge irrespective of the discharged quantity, such as NiCd and NiMH batteries. However, the power supply device of the second embodiment can also be applied to a battery whose voltage drops with the progress of discharging such as the one shown in FIG. 2.

Figure 11:
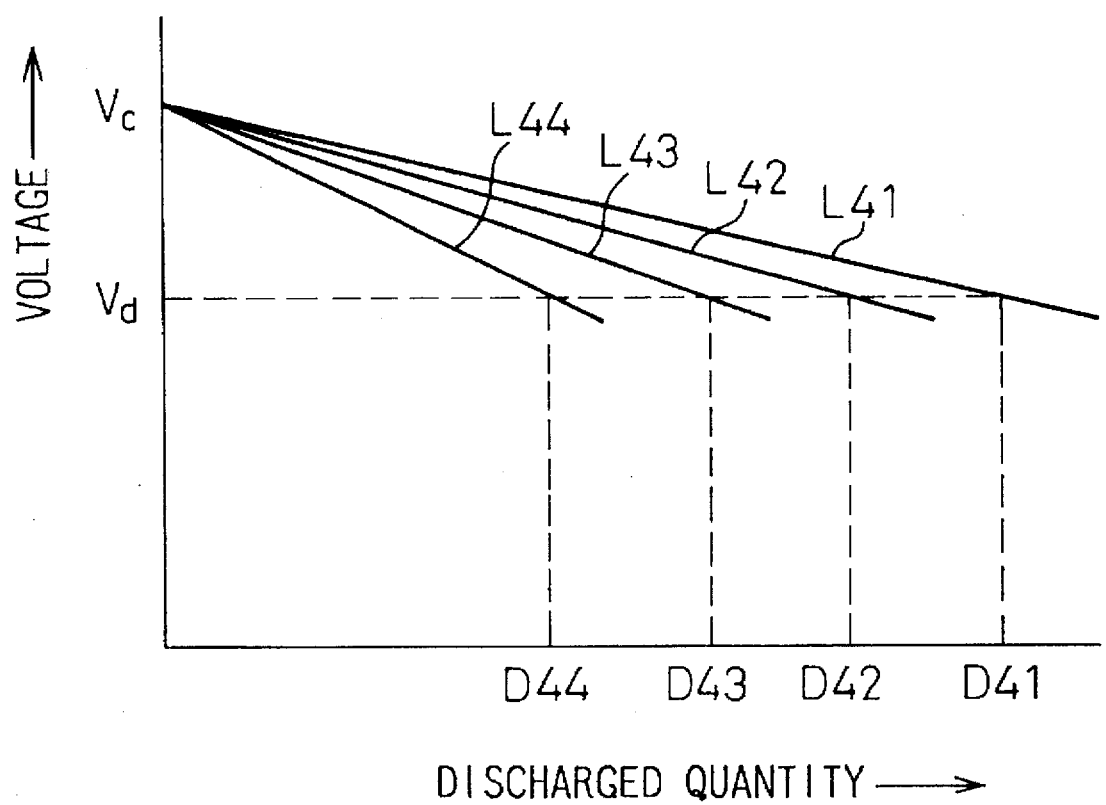
FIG. 11 is a diagram showing the decrease of a battery capacity due to repetition of a charge-discharge cycle in a lithium secondary battery or a dry battery.

FIG. 11 shows that the battery capacity of a lithium secondary battery or a dry cell battery decreased with repetitive charge-discharge cycle. Assuming that a battery finishes discharging at the discharged quantity D41 as indicated by a straight line L41, a battery whose capacity decreases with repetitive charge-discharge finishes discharge at a smaller discharged quantity D42 as indicated by a straight line L42. When charge-discharge cycles are further repeated, the battery capacity decreases to D43 and D44 as indicated by straight lines L43 and L44.

When such a battery is used as the battery 101 of the circuit shown in FIGS. 4 or 10 and when the remaining battery capacity calculation part 122 executes the processing shown in the flowcharts of FIGS. 7, 8 and 9, the remaining battery capacity can be calculated by accumulating the current values. Even when the battery capacity decreases with repetitive charge-discharge cycles, it is possible to estimate the remaining battery capacity by correcting the battery capacity used for calculation.

Figure 12:
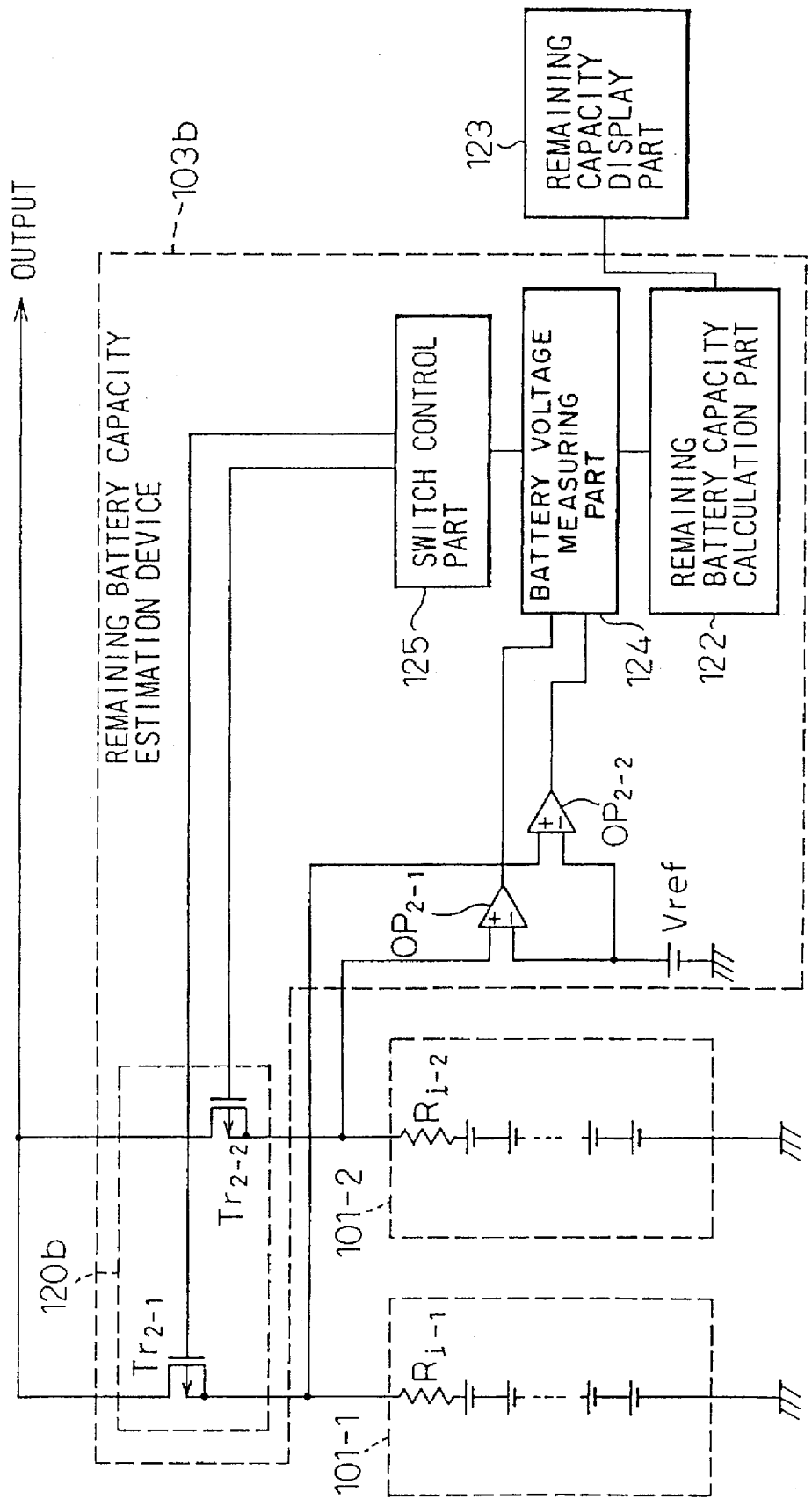
FIG. 12 as a circuit diagram of the third embodiment of the present invention.

FIG. 12 shows the third embodiment of the present invention. A power supply device shown in FIG. 12 includes two batteries connected in parallel via switch circuits. The two switch circuits turn ON/OFF alternately, so that the two batteries output electric power alternately. A non-load battery voltage of a battery is measured when the switch circuit of the battery is OFF. This embodiment can be suitably applied to batteries whose voltage gradually decreases with the progress of discharge, such as lithium secondary batteries or dry cell batteries.

Referring to FIG. 12, reference numerals 101-1, 101-2 denote batteries and Ri-1, Ri-2 denote internal resistances. Reference numeral 103b denotes a battery remaining capacity estimation device.

In the battery remaining capacity estimation device 103b, reference numeral 120b denotes a switch circuit, and Tr2-1 and Tr2-2 denote p-channel MOS transistors for switching outputs of the batteries 101-1, 101-2, respectively. Reference numeral 125 denotes a switch control part, which periodically generates control signals for turning ON/OFF the transistors Tr2-1 and Tr2-2 alternately.

Reference numeral 124 denotes a battery voltage measuring part, which measures non-load voltages of the batteries 101-1, 101-2. Symbols OP2-1 and OP2-2 denote comparators, which compare the voltage measured from the batteries 101-1, 101-2 with a reference voltage Vref, and generate a voltage in accordance with the result of the comparison.

Reference numeral 122 denotes a remaining battery capacity calculating part, which calculates the remaining capacities of each of the batteries 101-1, 101-2 from the non-load voltages of the batteries 101-1, 101-2, and calculates the total remaining capacities of the batteries 101-1, 101-2.

Reference numeral 123 denotes a remaining battery capacity display part.

Next, the operation of the circuit shown in FIG. 12 will be explained.

The switch control part 125 turns ON/OFF Tr2-1 and Tr2-2 periodically and alternately. However, when one of Tr2-1 or Tr2-2 turns OFF, the other one has to turn ON so that the power supply apparatus can continuously output electric power. The battery voltage measuring part 124 measures the non-load voltage of the battery of which Tr2-1 or Tr2-2 is OFF on the basis of the output of the switch control part 125, and outputs the voltage to the remaining battery capacity calculating part 122.

The remaining battery capacity calculation part 122 calculates the discharged quantity of each of the batteries 101-1, 101-2 from the voltage input from the voltage obtaining part 124 in accordance with the graph shown in FIG. 2 or with a suitable calculation formula, and calculates the remaining capacity of each battery from the difference between the discharged quantity and the battery capacity. Further, the remaining battery capacity calculation part 122 calculates the total remaining capacity of the batteries 101-1, 101-2. The remaining display part 123 displays the total remaining battery capacity.

Figure 13:
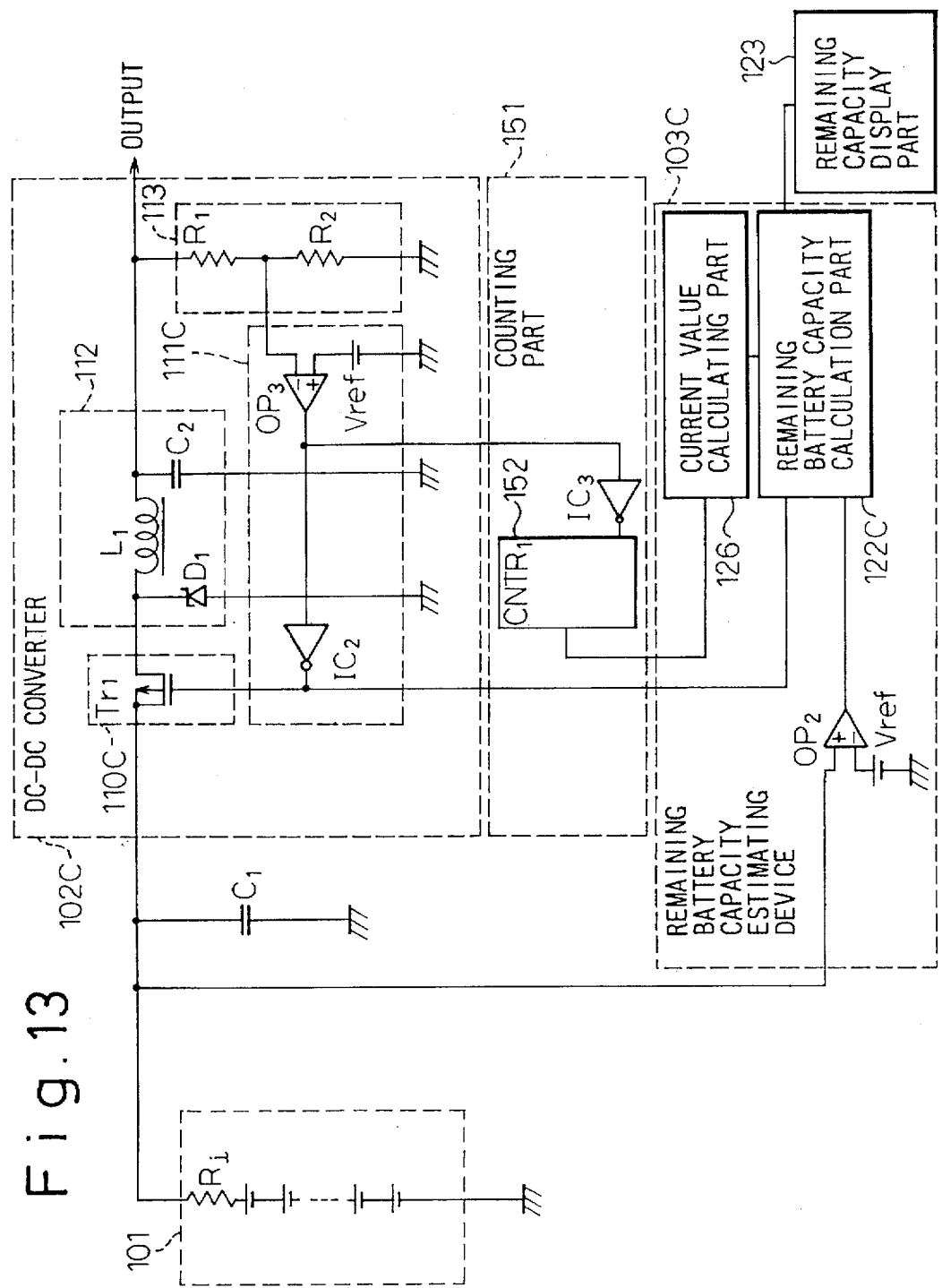
FIG. 13 as a circuit diagram of the fourth embodiment of the present invention.

FIG. 13 shows the fourth embodiment of the present invention. In the circuit shown in FIG. 13, current value is measured by counting the ON/OFF frequency of a switch circuit in a DC-DC converter. A power supply device shown in FIG. 13 can be suitably applied to a battery of the type in which the voltage remains constant during discharge irrespective of the discharged quantity but drops drastically at the finish of discharge, such as a NiCd battery or a NiMH battery.

Referring to FIG. 13, reference numeral 101 denotes a battery and Ri denotes an internal resistance. Reference numeral 102c denotes a DC-DC converter, reference numeral 103c denotes a battery remaining capacity estimation device, reference numeral 151 denotes a counting part, and reference numeral 123 denotes a remaining capacity display part. Symbol C1 is a capacitor.

In the DC-DC converter 102c, reference numeral 110c denotes a switch circuit, and Tr1 denotes a transistor for switching, in this case a p-channel MOS transistor. Reference numeral 112 denotes a rectification-smoothing part. Symbol L1 denotes a choke coil, C2 is a smoothing capacitor and D1 is a diode. Reference numeral 113 denotes an output voltage detection part, and R1 and R2 denote voltage division resistors. Reference numeral 111c denotes a switch control part.

In the switch control part 111c, reference numeral OP3 denotes a comparator, symbol IC2 denotes a buffer, and Vref is a reference voltage.

In the battery remaining capacity estimation device 103c, reference numeral 126 denotes a current value calculating part, OP2 is a camparator, which compares the voltage obtained from the battery 101 and the reference voltage Vref, and generates a voltage in accordance with the obtained voltage. Reference numeral 122c denotes a remaining battery capacity calculation part, which calculates the discharged quantity of the battery 101.

In the counting part 151, symbol IC3 is a buffer, reference numeral 152 denotes a counter, which counts the number of signals output from the switch control part 111c.

Next, the operation of the circuit shown in FIG. 13 will be explained.

The comparator OP3 compares the divided voltage output from the voltage division resistors R1, R2 and the reference voltage Vref. If the output voltage of the DC-DC converter 102c is lower than a predetermined value, the comparator OP3 outputs an ON signal, therefore Tr1 turns ON and the output voltage of the DC-DC converter 102c increases. If the output voltage of the DC-DC converter 102c exceeds a predetermined value, the comparator OP3 does not output the ON signal, therefore Tr1 turns OFF and the output voltage of the DC-DC converter 102c decreases.

By repeating the above operations, the DC-DC converter 102c keeps the output voltage constant. Further, the DC-DC converter 102c works as a self-excited switching regulator.

In the self-excited DC-DC converter 102c, the current value of Tr1 is represented as follows.

$$di/dt=(Vo-Vi)/L$$

(Vi is input voltage, Vo is output voltage of the DC-DC converter 102c. In this formula, a voltage drop across Tr1 is neglected.)

Therefore, the largest current Ipeak flowing through the choke coil L1 is determined by an inductance L thereof, the input voltage Vi, the output voltage Vo and on-time Ton as follows.

$$Ipeak=Ton \cdot (Vo-Vi)/L$$

The ON time Ton is determined by a phase delay of the comparator OP3 and a phase delay of Tr1. These phase delay values are determined by a circuit constant, so that the ON time Ton is usually constant in the self-excited switching regulator. Therefore, the battery current in FIG. 13 is obtained by counting the number of ON occurrences of Tr1.

The output voltage Vo of the DC-DC converter 102c is controlled by controlling an oscillation frequency 1/T as follows.

$V_O = V_i \cdot T_{on}/T$

In other words, the battery current in FIG. 13 is obtained by measuring the ON/OFF frequency of Tr1. In this method of measuring the battery current, even if the current is very small, the battery current is measured precisely.

The counter 152 counts the number of the ON signals output from the comparator OP3 in a certain period.

In the remaining battery capacity estimation device 103c, the current value calculating part 126 calculates the battery current value from the number counted by the counter 152. The remaining battery capacity calculation part 122c obtains the battery voltage from the comparator OP2 when Tr1 is OFF on the basis of the output of the switch control part 111c, and obtains the battery current from the current value calculating part 126. Then the remaining battery capacity calculation part 122c calculates the remaining battery capacity from the battery current and the battery voltage by the method shown in FIGS. 7, 8 and 9.

Figure 14:
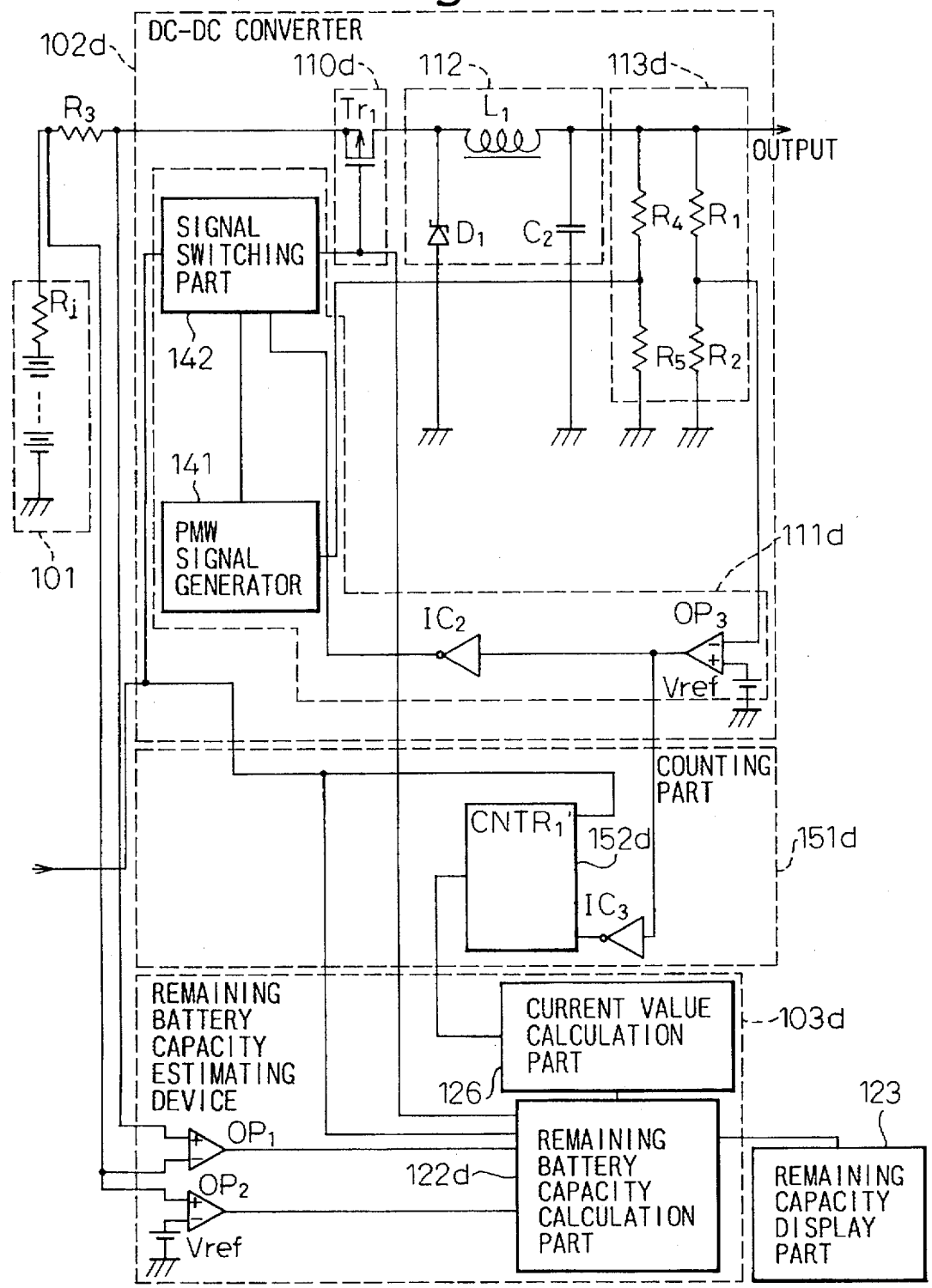
FIG. 14 as a circuit diagram of the fifth embodiment of the present invention.

FIG. 14 shows the fifth embodiment of the present invention. A DC-DC converter in this embodiment works as a self-excited switching regulator when the battery current is small, and works as a separately excited switching regulator when the battery current is large. The current value is calculated from counting the number of the ON occurrences of the switch when the battery current is small, and from measuring actual current by using a resistor when the battery current is large.

In FIG. 14, reference numeral 101 denotes a battery and Ri denotes an internal resistance. Reference numeral 102d denotes a DC-DC converter, reference numeral 103d denotes a battery remaining capacity estimation device, reference numeral 151 denotes a counting part, and reference numeral 123 denotes a remaining capacity display part.

In the DC-DC convertor 102d, reference numeral 110d denotes a switch circuit, and Tr1 denotes a transistor for switching, in this case a p-channel MOS transistor. Reference numeral 112 denotes a rectification-smoothing part. Symbol L1 denotes a choke coil, C2 is a smoothing capacitor and D1 is a diode. Reference numeral 113d denotes an output voltage detection portion, and R1, R2 and R4, R5 denote voltage division resistors. Reference numeral 111d denotes a switch control part.

In the switch control part 111c, reference numeral OP3 denotes a comparator, symbol IC2 denotes a buffer, and Vref is a reference voltage. Reference numeral 141 denotes a PWM (Pulse Width Modulation) signal generator, which generates a pulse signal having a certain width in accordance with the divided voltage of the resistors R4, R5. Reference numeral 142 denotes a signal switching part, which provides a signal output from the PWM signal generator 141 or the comparator OP3 to the switch circuit 110d in accordance with a RESUME signal.

In the counting part 151d, symbol IC3 is a buffer, reference numeral 152d denotes a counter, which counts the numbers of signals output from the switch control part 111d while the RESUME signal is OFF, and stops the counting when the RESUME signal turns ON.

In the battery remaining capacity estimation device 103d, symbol OP1 denotes a comparator, which compares the voltage at both ends of the resistor R3 and generates a voltage in accordance with the current flowing through the resistor R3. Symbol OP2 denotes a comparator, which compares the voltage obtained from the battery 101 and the reference voltage Vref, and generates a voltage in accordance with the obtained voltage. Reference numeral 126d denotes a current value calculating part. Reference numeral 122d denotes a remaining battery capacity calculation part, which obtains the battery current from the current value calculating part 126d or the comparator OP1 in accordance with the RESUME signal, and calculates the discharged quantity of the battery 101 using the battery current and voltage.

Next, the operation of the circuit shown in FIG. 14 will be explained with reference to the flowcharts of FIG. 15.

The RESUME signal is ON while a load of the power supply device is working or the battery current is large, and OFF while the load is not working or the battery current is small. This RESUME signal is output from a microcomputer (not shown) or from a switch (not shown) which is operated by an operator.

While the battery current is small, the signal switching part 142 provides the signal output from the comparator OP3 to the gate of Tr1 since the RESUME signal is OFF. Therefore, the DC-DC convertor 102d works as a self-excited switching regulator. The current value calculating part 126 calculates the battery current from the output of the counter 152d. In contrast, while the battery current is large, the signal switching part 142 provides the signal output from the PWM signal generator 141 to the gate of Tr1 since the RESUME signal is ON. Therefore, the DC-DC converter 102d works as a separately excited switching regulator.

The remaining battery capacity calculation part 122d calculates the remaining battery capacity from the battery current and the battery voltage by the same method as shown in FIGS. 7, 8 and 9. However, the step S11 in FIG. 7 and the step S31 in FIG. 9 are replaced by the steps 41 to 43 in FIG. 15.

Figure 15:
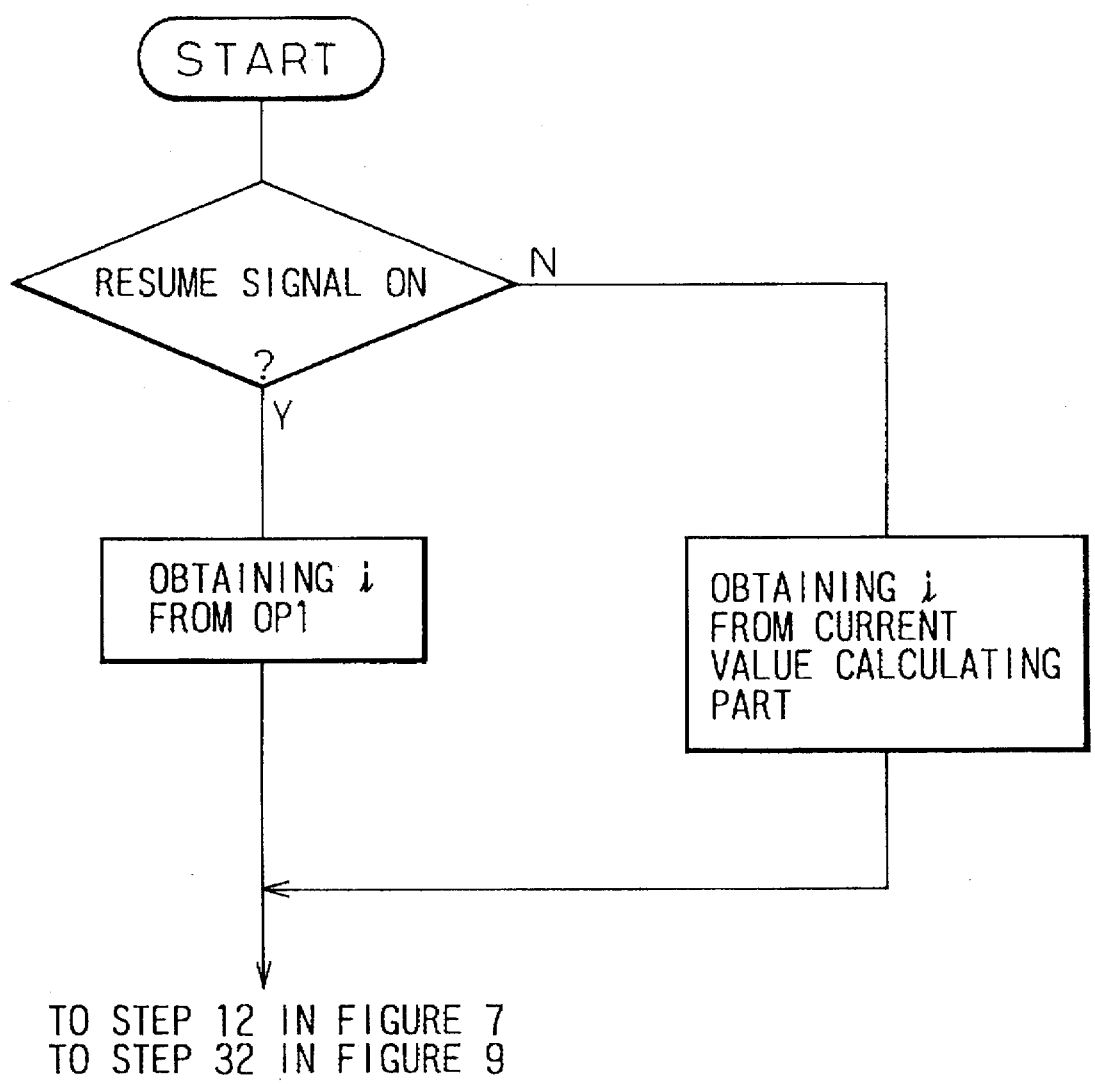
FIG. 15 as a flowchart useful for explaining the operation of the circuit shown in FIG. 14.

In FIG. 15, whether or not the RESUME signal is ON is determined at the step 41. If it proves YES, the flow proceeds to the step 42 and if it proves NO, the flow proceeds to the step 43. At the step 42, the battery current is obtained from the comparator OP1. At the step 43, the battery current is obtained from current value calculating part 126. Then the flow proceeds to the step 12 in FIG. 7 or the step 32' in FIG. 9. The subsequent operation is the same as explained above, therefore, an explanation thereof will be omitted.

With regard to the circuit shown in FIG. 14, the resistor R3 for measuring the battery current is only used when the battery current is large. Therefore, the resistance value of the resistor R3 can be reduced, and the electric power consumed by the resistor R3 can be reduced.

In the power supply device according to the present invention described above, the user can correctly grasp the remaining battery capacity. Therefore, the power supply device exhibits its effects when used for the power supply of various portable electronic appliances. Particularly when the power supply device is used for an information appliance such as a notebook type personal computer, the present invention can reliably prevent the problem that the remaining battery capacity becomes zero and the data being processed disappear.

Figures 16, 17:
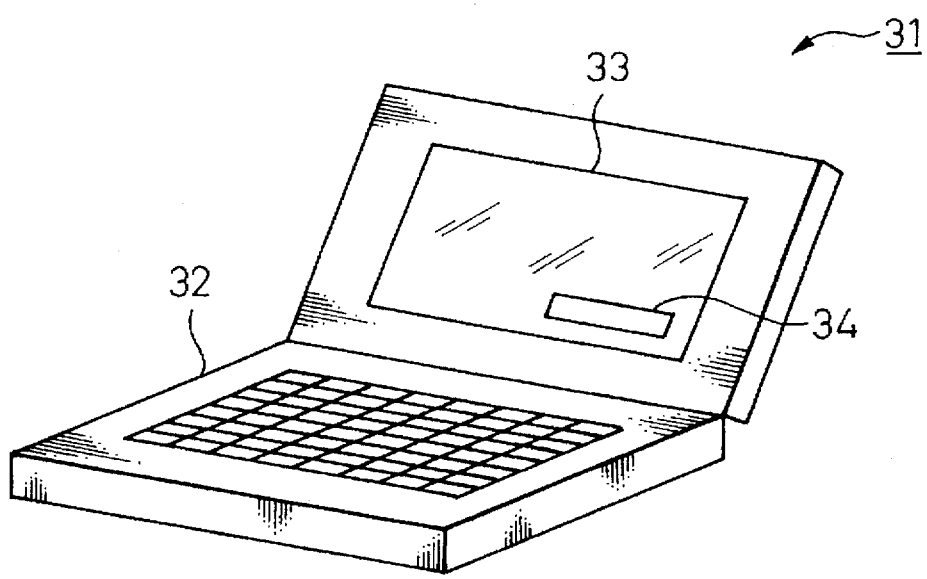
FIG. 16 shows the appearance of a notebook type personal computer with a built-in power supply device.
FIG. 17 shows an example of displaying the remaining battery capacity.

FIG. 16 shows the appearance of a notebook type personal computer with a built-in power supply device. This notebook type personal computer includes a keyboard part 32 and a display part 33, and a remaining battery capacity display part 34 is provided as part of the display 33. The display part 34 can display the remaining battery capacity as numerical values or by images. It can raise an alarm sound as a warning when the remaining battery capacity becomes small, or can turn on and off the display part 34 so as to attract the user's attention.

FIG. 16 shows an example of indicating the remaining battery capacity on the display part 34 in FIG. 15. In FIG.

17, (1) when the remaining battery capacity is zero, no mark is indicated; (2) when the ratio of the remaining battery capacity is under 10%, one mark turns on and off repeatedly; (3) when the ratio of the remaining battery capacity is 10 to 25%, one mark is indicated; (4) when the ratio of the remaining battery capacity is 25 to 50%, two marks are indicated; (5) when the ratio of the remaining battery capacity is 50 to 75%, three marks are indicated; (4) when the ratio of the remaining battery capacity is over 75%, four marks are indicated.

The present invention can correctly estimate the remaining capacity of the battery by measuring the non-load voltage under the ordinary state of use, and can therefore effectively utilize the battery. Because the remaining battery capacity is correctly displayed, the user can securely use the power supply device.

We claim:

1. A power supply apparatus comprising:

a battery;

a voltage conversion means for converting an output voltage of the battery to a predetermined voltage value and for outputting the converted voltage, said voltage conversion means having a main voltage conversion control switch which turns said voltage conversion means ON and OFF periodically and alternately so as to continuously generate the predetermined voltage value; and a remaining battery capacity estimation means including
      battery voltage measuring means for measuring a voltage of the battery when the main voltage conversion control switch means is OFF and the battery is in a non-load state, and
      a remaining battery capacity calculation means for calculating a remaining battery capacity on the basis of the voltage measured by the battery voltage measuring means.

2. A power supply apparatus according to claim 1, including:

a display means for displaying the remaining battery capacity calculated.

3. A power supply apparatus according to claim 1, wherein said remaining battery capacity estimation means further comprises:

a switch circuit for alternately and periodically switching the battery voltage measuring means in such a way that an ON-OFF condition of the switch circuit becomes substantially phase-revered to that of the main voltage conversion control switch.

4. A power supply apparatus according to claim 2, wherein the remaining battery capacity calculation means causes the display means to display the state where the remaining battery capacity is small, when the voltage measured by the battery voltage measuring means is lower than a rated value.

5. A power supply apparatus comprising:

plural batteries;

a switching means for switching periodically and alternately output of the plural batteries so that the power supply apparatus continuously outputs electric power; and a remaining battery capacity estimation means including
      a battery voltage measuring means for measuring voltages from each battery when the switching means of the battery is OFF and the battery is in a non-load state, and
      a remaining battery capacity calculation means for calculating a remaining capacity of each battery on the basis of the voltage measured by the battery voltage measuring means and for calculating the total remaining capacity of all of the batteries.

6. A power supply apparatus according to claim 5, including:

a display means for displaying the remaining battery capacity calculated.

7. A power supply apparatus according to claim 5, wherein the remaining battery capacity calculation means causes the display means to display the state where the remaining battery capacity is small, when the voltage measured by the battery voltage measuring means is lower than a predetermined value.

8. A power supply apparatus comprising:

a battery;

a voltage conversion means, having a main voltage conversion control switch which turns said voltage conversion means ON and OFF, for converting an output voltage of the battery to a predetermined voltage value and for outputting the converted voltage; and a remaining battery capacity estimation means including:
      a battery capacity memory means for storing capacity of the battery,
      a battery voltage measuring means for measuring a voltage of the battery when the main voltage conversion control switch means is OFF,
      a battery current obtaining means for obtaining a discharge current of the battery by measuring the battery current,
      a battery current accumulating means for calculating an accumulated value of the battery current obtained by the battery current obtaining means,
      a remaining battery capacity calculation means for calculating the remaining battery capacity from the battery capacity stored in the battery capacity memory means and the accumulated value of the battery current, and
      a judgement means for determining a state where the remaining battery capacity is small, when the voltage measured by the battery voltage measuring means drops lower than a predetermined value.

9. A power supply apparatus according to claim 8 including a means for storing a battery current accumulated value in the remaining battery capacity calculation means, into the battery capacity memory means when the voltage measured by the battery voltage measuring means is lower than a predetermined value.

10. A power supply apparatus according to claim 8, including a display means for displaying the remaining battery capacity calculated.

11. A power supply apparatus according to claim 8, wherein the remaining battery capacity calculation means causes the display means to display the state where the remaining battery capacity is small, on the basis of the determination said judgement means.

12. A power supply apparatus comprising:

a battery;

a voltage conversion means, having a main voltage conversion control switch which turns said voltage conversion means ON and OFF, for converting an output voltage of the battery to a predetermined voltage value and for outputting the converted voltage; and a remaining battery capacity estimation means including:
      a battery capacity memory means for storing capacity of the battery,
      a battery voltage measuring means for measuring a voltage of the battery when the main voltage conversion control switch means is OFF, a battery current obtaining means for obtaining a discharge current of the battery by measuring the battery current, a discharged power calculating means for calculating the discharged power from the battery voltage measured by the battery voltage measuring means and the battery current obtained by the battery current obtaining means, a discharged quantity accumulation means for calculating an accumulated value of the discharged power obtained by the discharged power calculating means, a remaining battery capacity calculation means for calculating the remaining battery capacity from the battery capacity stored in the battery capacity memory means and the accumulated value of the discharged power, and a judgement means for determining a state where the remaining battery capacity is small, when the voltage measured by the battery voltage measuring means drops lower than a predetermined value.

13. A power supply apparatus according to claim 12, including a means for storing a battery current accumulated value in the remaining battery capacity calculation means, into the battery capacity memory means when the voltage obtained by the battery voltage measuring means is lower than a predetermined value.

14. A power supply apparatus according to claim 12, including a display means for displaying the remaining battery capacity calculated.

15. A power supply apparatus according to claim 12, wherein the remaining battery capacity calculation means causes the display means to display the state where the remaining battery capacity is small, on the basis of the determination by said judgement means.

16. A power supply apparatus comprising:

a battery;

a voltage conversion means, having a main voltage conversion control switch which turns said voltage conversion means ON and OFF, for converting an output voltage of the battery to a predetermined voltage value and for Outputting the converted voltage and for working as a self-excited switch regulator;

a counting means for counting a number of ON or OFF actions of the main voltage conversion control switch means; and a remaining battery capacity estimation means including:
  a battery capacity memory means for storing the capacity of the battery,
  a battery voltage measuring means for measuring a voltage of the battery when the main voltage conversion control switch means is OFF,
  a battery current obtaining means for obtaining a discharge current of the battery from the counted numbers obtained by the counting means,
  a battery current accumulating means for calculating an accumulated value of the battery current obtained by the battery current obtaining means,
  a remaining battery capacity calculation means for calculating the remaining battery capacity from the battery capacity stored in the battery capacity memory means and the accumulated value of the battery current, and
  a judgement means for determining a state where the remaining battery capacity is small, when the voltage measured by the battery voltage measuring means drops lower than a predetermined value.

17. A power supply apparatus according to claim 16 including a means for storing a battery current accumulated value in the remaining battery capacity calculation means, into the battery capacity memory means when the voltage measured by the battery voltage measuring means is lower than a predetermined value.

18. A power supply apparatus according to claim 16 including a display means for displaying the remaining battery capacity calculated.

19. A power supply apparatus according to claim 17 wherein the remaining battery capacity calculation means causes the display means to display the state where the remaining battery capacity is small, on the basis of the determination by said judgement means.

20. A power supply apparatus comprising:

a battery;

a voltage conversion means, having a main voltage conversion control switch which turns said voltage conversion means ON and OFF, for converting an output voltage of the battery to a predetermined voltage value and for outputting the converted voltage and for working as a self-excited switching regulator;

a counting means for counting a number of ON or OFF actions of the main voltage conversion control switch means; and a remaining battery capacity estimation means including:
  a battery capacity memory means for storing a capacity of the battery,
  a battery voltage measuring means for measuring a voltage of the battery when the main voltage conversion control switch means is OFF,
  a battery current obtaining means for obtaining a discharge current of the battery from the counted numbers obtained by the counting means,
  a discharged power calculating means for calculating the discharged power from the battery voltage measured by the battery voltage measuring means and the battery current obtained by the battery current obtaining means,
  a discharged quantity accumulation means for calculating an accumulated value of the discharged power obtained by the discharged power calculating means,
  a remaining battery capacity calculation means for calculating the remaining battery capacity from the battery capacity stored in the battery capacity memory means and the accumulated value of the discharged power, and
  a judgement means for determining a state where the remaining battery capacity is small, when the voltage measured by the battery voltage measuring means drops lower than a predetermined value.

21. A power supply apparatus according to claim 20 including a means for storing a battery current accumulated value in the remaining battery capacity calculation means, into the battery capacity memory means when the voltage measured by the battery voltage measuring means is lower than a predetermined value.

22. A power supply apparatus according to claim 20 including a display means for displaying the remaining battery capacity calculated.

23. A power supply apparatus according to claim 20 wherein the remaining battery capacity calculation means causes the display means to display the state where the remaining battery capacity is small, on the basis of the determination by said judgement means.

24. A power supply apparatus comprising:

a battery;

a voltage conversion means, having a main voltage conversion control switch which turns said voltage conversion means ON and OFF, for converting an output voltage of the battery to a predetermined voltage value and for outputting the converted voltage and for working as a self-excited switching regulator or a separately excited switching regulator;

a counting means for counting a number of ON or OFF actions of the main voltage conversion control switch means; and a remaining battery capacity estimation means including:
- a battery capacity memory means for storing capacity of the battery,
- a battery voltage measuring means for measuring a voltage of the battery when the main voltage conversion control switch means is OFF,
- a first battery current obtaining means for obtaining a discharge current of the battery from the counted number obtained by the counting means while the voltage conversion means is working as the self-excited switching regulator,
- a second battery current obtaining means for obtaining a discharge current of the battery by measuring the battery current while the voltage conversion means is working as the separately excited switching regulator,
- a battery current accumulating means for calculating an accumulated value of the battery current obtained by the first battery current obtaining means and the second battery current obtaining means,
- a remaining battery capacity calculation means for calculating the remaining battery capacity from the battery capacity stored in the battery capacity memory means and the accumulated value of the battery current, and
- a judgement means for determining a state where the remaining battery capacity is small, when the voltage measured by the battery voltage measuring means drops lower than a predetermined value.

25. A power supply apparatus according to claim 24 including a means for storing a battery current accumulated value in the remaining battery capacity calculation means, into the battery capacity memory means when the voltage measured by the battery voltage measuring means is lower than a predetermined value.

26. A power supply apparatus according to claim 24, including a display means for displaying the remaining battery capacity calculated.

27. A power supply apparatus according to claim 24, wherein the remaining battery capacity calculation means causes the display means to display the state where the remaining battery capacity is small, on the basis of the determination by said judgement means.

28. A power supply apparatus comprising:

a battery;

a voltage conversion means, having a main voltage conversion control switch which turns said voltage conversion means ON and OFF, for converting an output voltage of the battery to a predetermined voltage value and for outputting the converted voltage and for working as a self-excited switching regulator or a separately excited switching regulator;

a counting means for counting a number of ON or OFF actions of the main voltage conversion control switch means; and a remaining battery capacity estimation means including:
- a battery capacity memory means for storing capacity of the battery,
- a battery voltage measuring means for measuring a voltage of the battery when the main voltage conversion control switch means is OFF,
- a first battery current obtaining means for obtaining a discharge current of the battery from the counted number obtained by the counting means while the voltage conversion means is working as the self-excited switching regulator,
- a second battery current obtaining means for obtaining a discharge current of the battery by measuring the battery current while the voltage conversion means is working as the separately excited switching regulator,
- a discharged power calculating means for calculating the discharged power from the battery voltage measured by the battery voltage measuring means and the battery current obtained by the first battery current obtaining means or the second battery current obtaining means,
- a discharged quantity accumulation means for calculating an accumulated value of the discharged power obtained by the discharged power calculating means,
- a remaining battery capacity calculation means for calculating the remaining battery capacity from the battery capacity stored in the battery capacity memory means and the accumulated value of the discharged power, and
- a judgement means for determining a state where the remaining battery capacity is small, when the voltage measured by the battery voltage measuring means drops lower than a predetermined value.

29. A power supply apparatus according to claim 28 including a means for storing a battery current accumulated value in the remaining battery capacity calculation means, into the battery capacity memory means when the voltage measured by the battery voltage measuring means is lower than a predetermined value.

30. A power supply apparatus according to claim 28 including a display means for displaying the remaining battery capacity calculated.

31. A power supply apparatus according to claim 28, wherein the remaining battery capacity calculation means causes the display means to display the state where the remaining battery capacity is small, on the basis of the determination by said judgement means.

32. An electronic appliance comprising:

a power supply apparatus including
- a battery;
- a voltage conversion means for converting an output voltage of the battery to a predetermined voltage value and for outputting the converted voltage, said voltage conversion means having a main voltage conversion control switch which turns said voltage conversion means ON and OFF periodically and alternately so as to continuously generate the predetermined voltage value; and
- a remaining battery capacity estimation means including
  - a battery voltage measuring means for measuring a voltage of the battery when the main voltage conversion control switch means is OFF and the battery is in a non-load state, and
  - a remaining battery capacity calculation means for calculating a remaining battery capacity on the basis of the voltage measured by the battery voltage measuring means.

33. A power supply apparatus according to claim 32, wherein said remaining battery capacity estimation means further comprises:

a switch circuit for alternately and periodically switching the battery voltage measuring means in such a way that an ON-OFF condition of the switch circuit becomes substantially phase-revered to that of the main voltage conversion control switch.

34. An electronic appliance equipped with a power supply apparatus according to claim 32 including a display means for displaying the remaining battery capacity calculated.

35. An electronic appliance equipped with a power supply apparatus according to claim 34, wherein the remaining battery capacity calculation means causes the display means to display the state where the remaining battery capacity is small, when the voltage measured by the battery voltage measuring means is lower than a rated value.

36. An electronic appliance comprising:
a power supply apparatus including
plural batteries;
a switching means for switching periodically and alternately output of the plural batteries so that the power supply apparatus continuously outputs electric power; and
a remaining battery capacity estimation means including
a battery voltage measuring means for measuring voltages from each battery when the switching means of the battery is OFF and the battery is in a non-load state; and
a remaining battery capacity calculation means which calculates a remaining capacity of each battery on the basis of the voltage measured by the battery voltage measuring means and calculates the total remaining capacity of all the batteries.

37. An electronic appliance equipped with a power supply apparatus according to claim 36, including a display means for displaying the remaining battery capacity calculated.

38. An electronic appliance equipped with a power supply apparatus according to claim 37, wherein the remaining battery capacity calculation means causes the display means to display the state where the remaining battery capacity is small, when the voltage measured by the battery voltage measuring means is lower than a predetermined value.

39. An electronic appliance equipped with a power supply apparatus comprising:
a battery;
a voltage conversion means, having a main voltage conversion control switch which turns said voltage conversion means ON and OFF, for converting an output voltage of the battery to a predetermined voltage value and for outputting the converted voltage; and
a remaining battery capacity estimation means including:
a battery capacity memory means for storing capacity of the battery,
a battery voltage measuring means for measuring a voltage of the battery when the main voltage conversion main control switch means is OFF,
a battery current obtaining means for obtaining a discharge current of the battery by measuring the battery current,
a battery current accumulating means for calculating an accumulated value of the battery current obtained by the battery current obtaining means,
a remaining battery capacity calculation means for calculating the remaining battery capacity from the battery capacity stored in the battery capacity memory means and the accumulated value of the battery current, and
a judgement means for determining a state where the remaining battery capacity is small, when the voltage measured by the battery voltage measuring means drops lower than a predetermined value.

40. An electronic appliance equipped with a power supply apparatus according to claim 39 including a means for storing a battery current accumulated value in the remaining battery capacity calculation means, into the battery capacity memory means when the voltage measured by the battery voltage measuring means is lower than a predetermined value.

41. An electronic appliance equipped with a power supply apparatus according to claim 39 including a display means for displaying the remaining battery capacity calculation calculated.

42. An electronic appliance equipped with a power supply apparatus according to claim 39, wherein the remaining battery capacity calculation means causes the display means to display the state where the remaining battery capacity is small, on the basis of the determination by said judgement means.

43. An electronic appliance equipped with a power supply apparatus comprising:
a battery;
a voltage conversion means, having a main voltage conversion control switch which turns said voltage conversion means ON and OFF, for converting an output voltage of the battery to a predetermined voltage value and for outputting the converted voltage; and
a remaining battery capacity estimation means including:
a battery capacity memory means for storing capacity of the battery,
a battery voltage measuring means for measuring a voltage of the battery when the main voltage conversion control switch means is OFF,
a battery current obtaining means for obtaining a discharge current of the battery by measuring the battery current,
a discharged power calculating means for calculating the discharged power from the battery voltage measured by the battery voltage measuring means and the battery current obtained by the battery current obtaining means,
discharged quantity accumulation means for calculating an accumulated value of the discharged power obtained by the discharged power calculating means,
a remaining battery capacity calculation means for calculating the remaining battery capacity from the battery capacity stored in the battery capacity memory means and the accumulated value of the discharged power, and
a judgement means for determining a state where the remaining battery capacity is small, when the voltage measured by the battery voltage measuring means drops lower than a predetermined value.

44. An electronic appliance equipped with a power supply apparatus according to claim 43 including a means for storing a battery current accumulated value in the remaining battery capacity calculation means, into the battery capacity memory means when the voltage measured by the battery voltage measuring means is lower than a predetermined value.

45. An electronic appliance equipped with a power supply apparatus according to claim 43 including a display means for displaying the remaining battery capacity calculated.

46. An electronic appliance according to claim 43, wherein the remaining battery capacity calculation means causes the display means to display the state where the remaining battery capacity is small, on the basis of the determination said judgement means.

47. An electronic appliance equipped with a power supply apparatus comprising:

a battery;

a voltage conversion means, having a main voltage conversion control switch which turns said voltage conversion means ON and OFF, for converting an output voltage of the battery to a predetermined voltage value and for outputting the converted voltage and for working a self-excited switching regulator;

a counting means for counting a number of ON or OFF actions of the main voltage conversion control switch means; and a remaining battery capacity estimation means including:

a battery capacity memory means for storing capacity of the battery, a battery voltage measuring means for measuring a voltage of the battery when the main voltage conversion control switch means is OFF, a battery current obtaining means for obtaining a discharge current of the battery from the counted numbers obtained by the counting means, a battery current accumulating means for calculating an accumulated value of the battery current obtained by the battery current obtaining means, a remaining battery capacity calculation means for calculating the remaining battery capacity from the battery capacity stored in the battery capacity memory means and the accumulated value of the battery current, and a judgement means for determining a state where the remaining battery capacity is small, when the voltage measured by the battery voltage measuring means drops lower than a predetermined value.

48. An electronic appliance equipped with a power supply apparatus according to claim 47 including a means for storing a battery current accumulated value in the remaining battery capacity calculation means, into the battery capacity memory means when the voltage measured by the battery voltage measuring means is lower than a predetermined value.

49. An electronic appliance equipped with a power supply apparatus according to claim 47 including a display means for displaying the remaining battery capacity calculated.

50. An electronic appliance equipped with a power supply apparatus according to claim 48, wherein the remaining battery capacity calculation means causes the display means to display the state where the remaining battery capacity is small, on the basis of the determination the judgement means.

51. An electronic appliance equipped with a power supply apparatus comprising:

a battery;

a voltage conversion means, having a main voltage conversion control witch which turns said voltage conversion means ON and OFF, for converting an output voltage of the battery to a predetermined voltage value and for outputting the converted voltage and for working as a self-excited switching regulator;

a counting means for counting a number of ON or OFF actions of the main voltage conversion control switch means; and a remaining battery capacity estimation means including:

a battery capacity memory means for storing capacity of the battery, a battery voltage measuring means for measuring a voltage of the battery when the main voltage conversion control switch means is OFF, a battery current obtaining means for obtaining a discharge current of the battery from the counted numbers obtained by the counting means, a discharged power calculating means for calculating the discharged power from the battery voltage measured by the battery voltage measuring means and the battery current obtained by the battery current obtaining means, a discharged quantity accumulation means for calculating an accumulated value of the discharged power obtained by the discharged power calculating means, a remaining battery capacity calculation means for calculating the remaining battery capacity from the battery capacity stored in the battery capacity memory means and the accumulated value of the discharged power, and a judgement means for determining a state where the remaining battery capacity is small, when the voltage measured by the battery voltage measuring means drops lower than a predetermined value.

52. An electronic appliance equipped with a power supply apparatus according to claim 51 including a means for storing a battery current accumulated value in the remaining battery capacity calculation means, into the battery capacity memory means when the voltage measured by the battery voltage measuring means is lower than a predetermined value.

53. An electronic appliance equipped with a power supply apparatus according to claim 51 including a display means for displaying the remaining battery capacity calculated.

54. An electronic appliance equipped with a power supply apparatus according to claim 51, wherein the remaining battery capacity calculation means causes the display means to display the state where the remaining battery capacity is small, on the basis of the determination of said judgement means.

55. An electronic appliance equipped with a power supply apparatus comprising:

a battery;

a voltage conversion means, having a main voltage conversion control switch which turns said voltage conversion means ON and OFF, for converting an output voltage of the battery to a predetermined voltage value and for outputting the converted voltage and for working as a self-excited switching regulator or a separately excited switching regulator;

a counting means for counting a number of ON or OFF actions of the main voltage conversion control switch means; and a remaining battery capacity estimation means including:

a battery capacity memory means for storing capacity of the battery, a battery voltage measuring means for measuring a voltage of the battery when the main voltage conversion control switch means is OFF, a first battery current obtaining means for obtaining a discharge current of the battery from the counted number obtained by the counting means while the voltage conversion means is working as the self-excited switching regulator, a second battery current obtaining means for obtaining a discharge current of the battery by measuring the battery current while the voltage conversion means is working as the separately excited switching regulator, a battery current accumulating means for calculating an accumulated value of the battery current obtained by the first battery current obtaining means and the second battery current obtaining means, a remaining battery capacity calculation means for calculating the remaining battery capacity from the battery capacity stored in the battery capacity memory means and the accumulated value of the battery current, and a judgement means for determining a state where the remaining battery capacity is small, when the voltage measured by the battery voltage measuring means drops lower than a predetermined value.

56. An electronic appliance equipped with a power supply apparatus according to claim 55 including a means for storing a battery current accumulated value in the remaining battery capacity calculation means, into the battery capacity memory means when the voltage measured by the battery voltage measuring means is lower than a predetermined value.

57. An electronic appliance equipped with a power supply apparatus according to claim 55 including a display means for displaying the remaining battery capacity calculated.

58. An electronic appliance equipped with a power supply apparatus according to claim 55, wherein the remaining battery capacity calculation means causes the display means to display the state where the remaining battery capacity is small, on the basis of the determination by said judgement means.

59. An electronic appliance equipped with a power supply apparatus comprising:

a battery;

a voltage conversion means, having a main voltage conversion control switch which turns said voltage conversion means ON and OFF, for converting an output voltage of the battery to a predetermined voltage value and for outputting the converted voltage and for working as a self-excited switching regulator or a separately excited switching regulator;

a counting means for counting a number of ON or OFF actions of the main voltage conversion control switch means; and a remaining battery capacity estimation means including:

a battery capacity memory means for storing capacity of the battery, a battery voltage measuring means for measuring a voltage of the battery when the main voltage conversion control switch means is OFF, a first battery current obtaining means for obtaining a discharge current of the battery from the counted number obtained by the counting means while the voltage conversion means is working as the self-excited switching regulator, a second battery current obtaining means for obtaining a discharge current of the battery by measuring the battery current while the voltage conversion means is working as the separately excited switching regulator, a discharged power calculating means for calculating the discharged power from the battery voltage measured by the battery voltage measuring means and the battery current obtained by the first battery current obtaining means or the second battery current obtaining means, a discharged quantity accumulating means for calculating an accumulated value of the discharged power obtained by the discharged power calculating means, a remaining battery capacity calculation means for calculating the remaining battery capacity from the battery capacity stored in the battery capacity memory means and the accumulated value of the discharged power, and a judgement means for determining a state where the remaining battery capacity is small, when the voltage measured by the battery voltage measuring means drops lower than a predetermined value.

60. An electronic appliance equipped with a power supply apparatus according to claim 59 including a means for storing a battery current accumulated value in the remaining battery capacity calculation means, into the battery capacity memory means when the voltage measured by the battery voltage measuring means is lower than a predetermined value.

61. An electronic appliance equipped with a power supply apparatus according to claim 59 including a display means for displaying the remaining battery capacity calculated.

62. An electronic appliance equipped with a power supply apparatus according to claim 59, wherein the remaining battery capacity calculation means causes the display means to display the state where the remaining battery capacity is small, on the basis of the determination by said judgement means.

* * * * *

UNITED STATES PATENT AND TRADEMARK OFFICE
CERTIFICATE OF CORRECTION

PATENT NO. : 5,717,256

DATED : February 10, 1998

INVENTOR(S) : Okumura et al.

It is certified that error appears in the above-identified patent and that said Letters Patent is hereby corrected as shown below:

Column 13, line 47, delete "-revered" insert therefor

-- -reversed --

Column 18, line 65, delete "A power supply apparatus" insert therefor -- An electronic appliance --

Column 19, line 4, delete "-revered" insert therefor

-- -reversed --

Column 19, lines 6-7, 9-10, 32-33 and 35-36, after "appliance" and before "according" delete "equipped with a power supply apparatus"

Signed and Sealed this

Fourth Day of July, 2000

Attest:

Q. TODD DICKINSON

*Attesting Officer*  *Director of Patents and Trademarks*